US010992892B2

(12) United States Patent
Ikeda et al.

(10) Patent No.: US 10,992,892 B2
(45) Date of Patent: Apr. 27, 2021

(54) IMAGE SENSOR AND IMAGING APPARATUS

(71) Applicant: Sony Semiconductor Solutions Corporation, Kanagawa (JP)

(72) Inventors: Yusuke Ikeda, Tokyo (JP); Eiji Hirata, Tokyo (JP); Kazunori Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/339,730

(22) PCT Filed: Oct. 10, 2017

(86) PCT No.: PCT/JP2017/036666
§ 371 (c)(1),
(2) Date: Apr. 5, 2019

(87) PCT Pub. No.: WO2018/070377
PCT Pub. Date: Apr. 19, 2018

(65) Prior Publication Data
US 2019/0313047 A1     Oct. 10, 2019

(30) Foreign Application Priority Data

Oct. 13, 2016  (JP) .............................. JP2016-201652

(51) Int. Cl.
*H04N 5/3745*    (2011.01)
*H01L 27/146*    (2006.01)
*H04N 5/363*     (2011.01)

(52) U.S. Cl.
CPC ... *H04N 5/37452* (2013.01); *H01L 27/14612* (2013.01); *H01L 27/14643* (2013.01); *H04N 5/363* (2013.01); *H04N 5/37455* (2013.01)

(58) Field of Classification Search
CPC ......... H01L 27/14612; H01L 27/14643; H01L 27/14609; H01L 27/14601; H04N 5/374;
(Continued)

(56) References Cited

U.S. PATENT DOCUMENTS 6,831,486 B1 * 12/2004 Hynecek ............ H04N 5/37452
327/514
9,917,119 B2 * 3/2018 Murakami ........ H01L 27/14632
(Continued)

FOREIGN PATENT DOCUMENTS

| EP | 1508920 A1 | 2/2005 |
|---|---|---|
| JP | 2005-110275 A | 4/2005 |
| JP | 2016-058772 A | 4/2016 |

OTHER PUBLICATIONS

International Preliminary Report on Patentability dated Apr. 25, 2019 in connection with International Application No. PCT/JP2017/036666.

(Continued)

*Primary Examiner* — Chiawei Chen
(74) *Attorney, Agent, or Firm* — Wolf, Greenfield & Sacks, P.C.

(57) ABSTRACT

There is provided an imaging device that includes a pixel, the pixel comprising: a photodetector; a control transistor; a capacitor coupled to the photodetector; a reset transistor coupled between the control transistor and the capacitor; an amplifier transistor having a gate terminal coupled to the capacitor; and a select transistor coupled to the amplifier transistor; a first signal line coupled to the select transistor; and a first amplifying circuit including a first input terminal coupled to the first signal line and a second input terminal configured to receive a first reference signal and an output terminal coupled to the control transistor.

20 Claims, 17 Drawing Sheets

(58) Field of Classification Search
CPC .............. H04N 5/37457; H04N 5/363; H04N 5/37452; H04N 5/37455; H04N 5/3745
See application file for complete search history.

(56) References Cited

U.S. PATENT DOCUMENTS

| | | | |
|---|---|---|---|
| 2005/0040320 A1* | 2/2005 | Lule .................. | H01L 27/14609 250/214 R |
| 2008/0258047 A1* | 10/2008 | Sakakibara ............... | G01J 1/44 250/214 C |
| 2012/0218451 A1* | 8/2012 | Rajasekaran .......... | H04N 5/363 348/302 |
| 2013/0314574 A1* | 11/2013 | Ishii .................... | H01L 27/1464 348/302 |
| 2014/0131554 A1* | 5/2014 | Ishii .................. | H01L 27/14692 250/208.1 |
| 2016/0150175 A1* | 5/2016 | Hynecek ................ | H04N 5/363 250/208.1 |
| 2016/0225803 A1* | 8/2016 | Korobov ........... | H01L 27/14614 |
| 2019/0371839 A1* | 12/2019 | Sato ....................... | H04N 5/359 |

OTHER PUBLICATIONS

International Search Report and Written Opinion dated Jan. 23, 2018 in connection with International Application No. PCT/JP2017/036666.
Japanese Office Action dated Oct. 27, 2020 in connection with Japanese Application No. 2016-201652 and English translation thereof.

* cited by examiner

[Fig. 1]
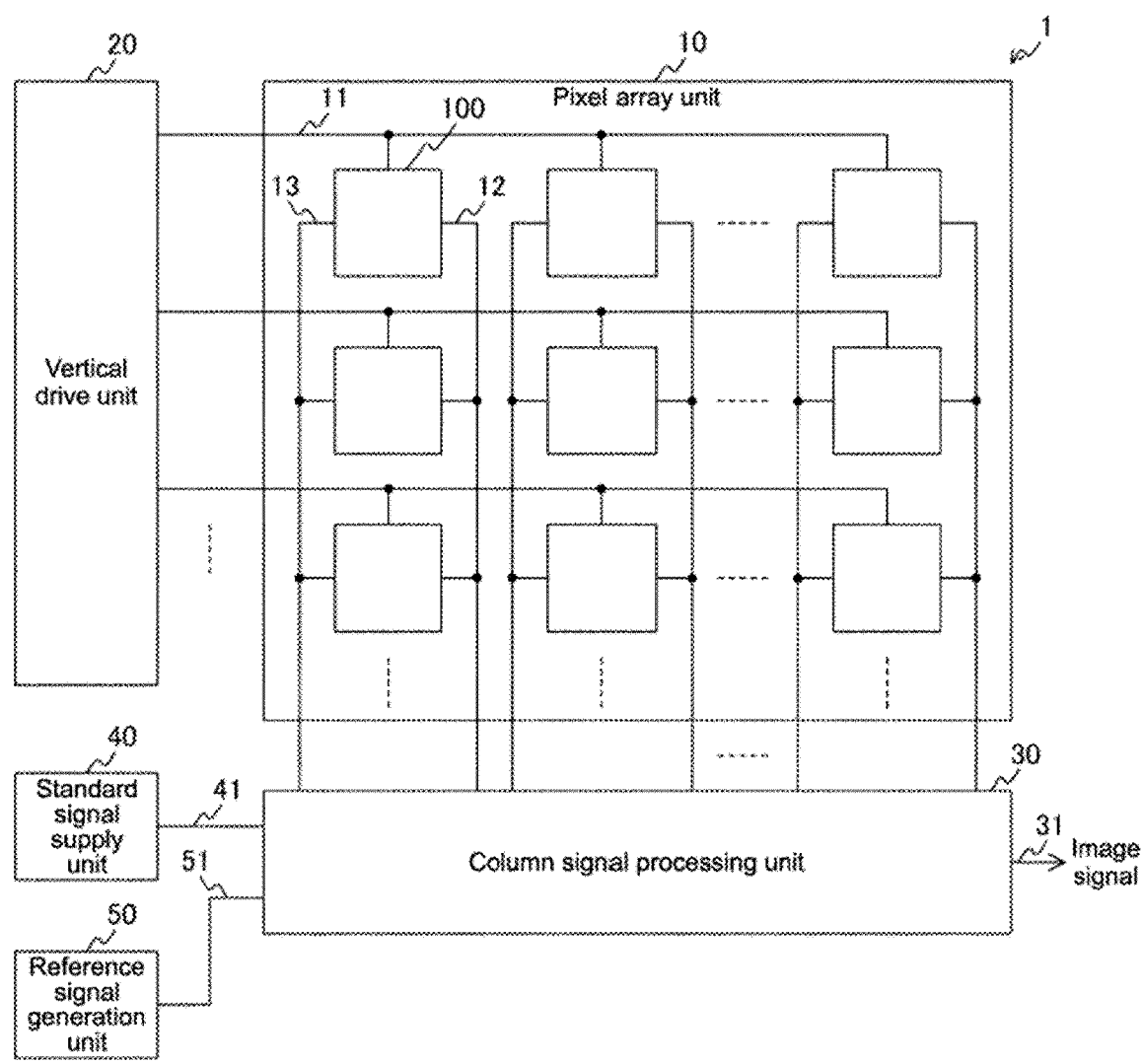

[Fig. 2]
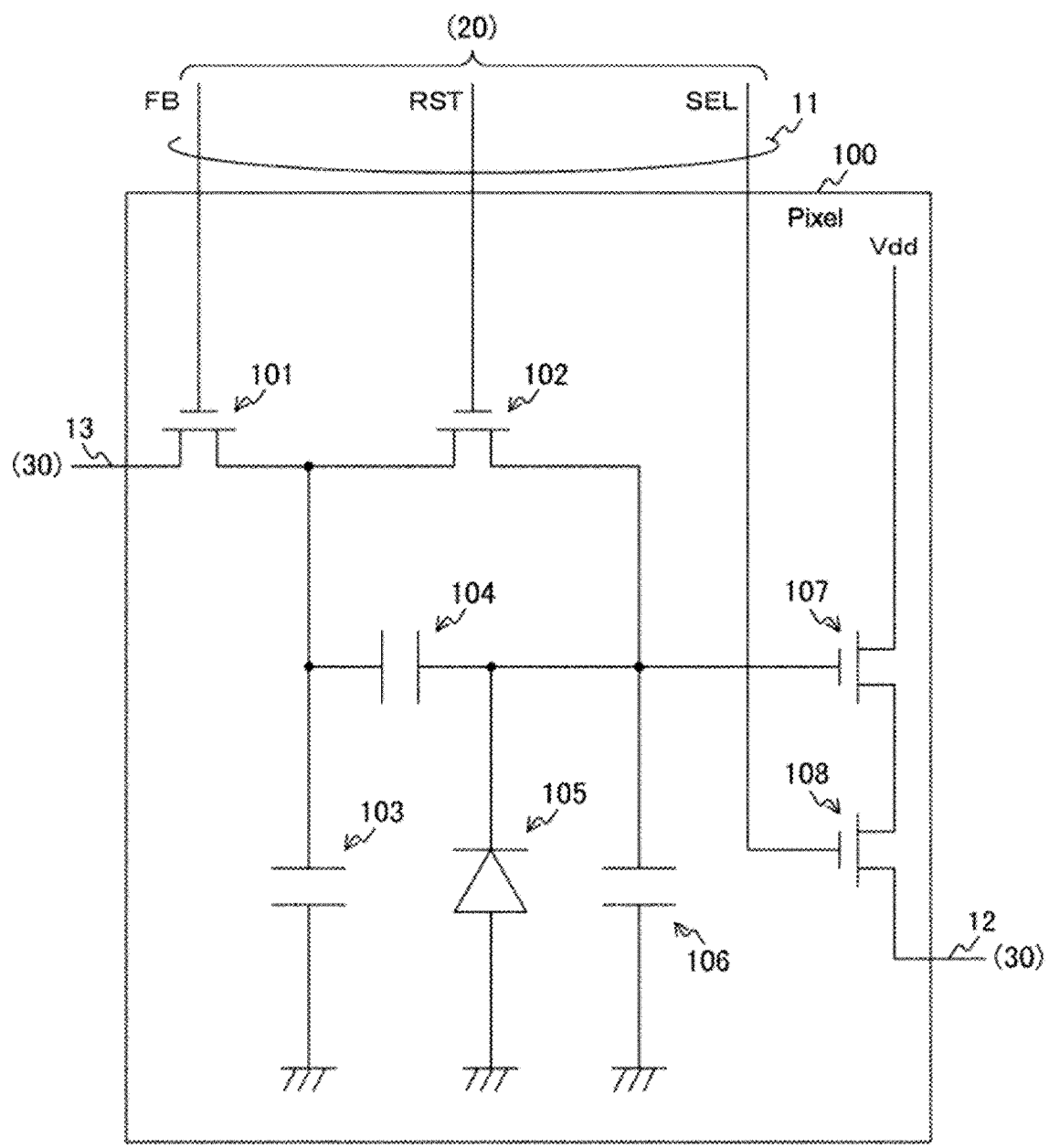

[Fig. 3]
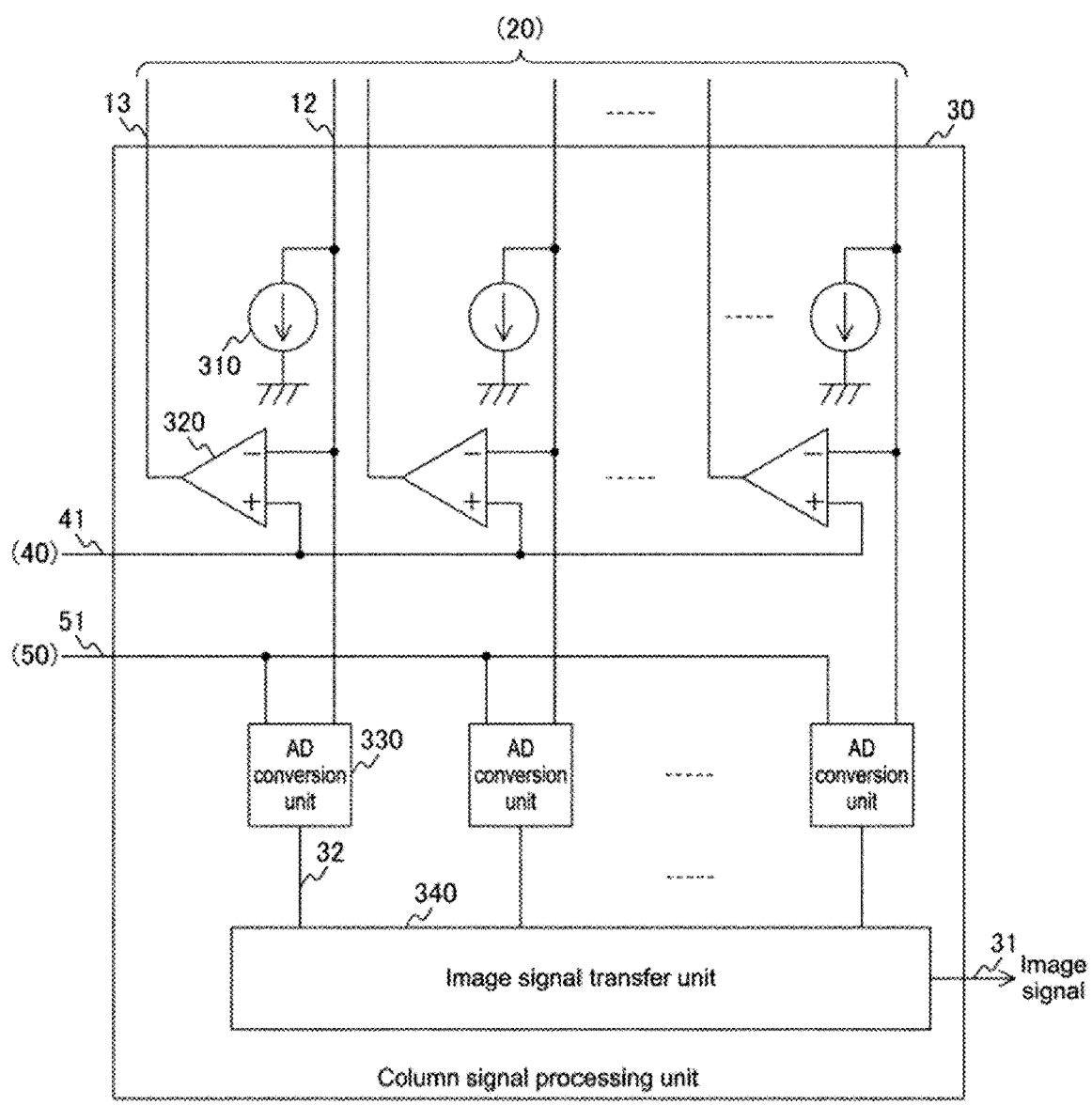

[Fig. 4]
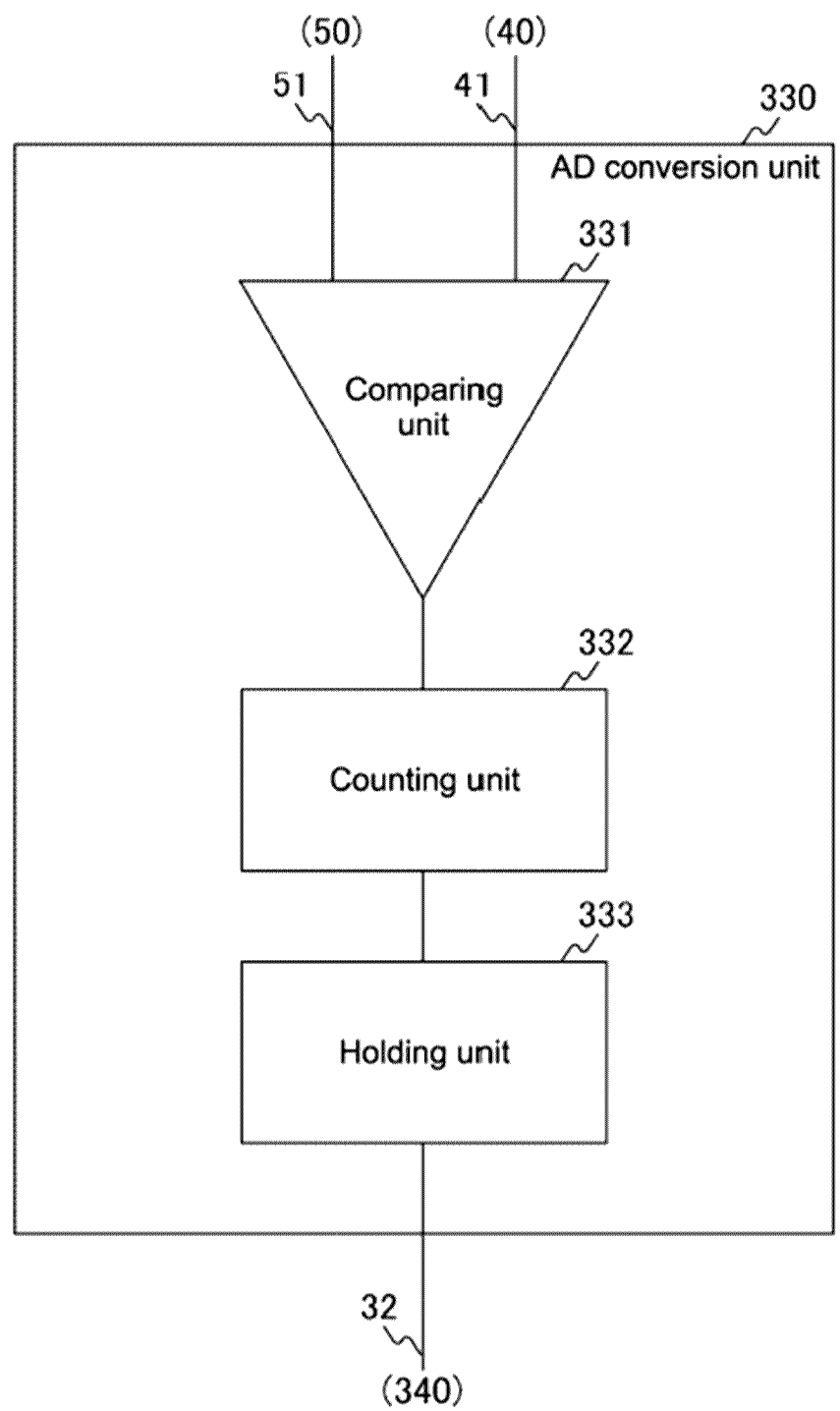

[Fig. 5]
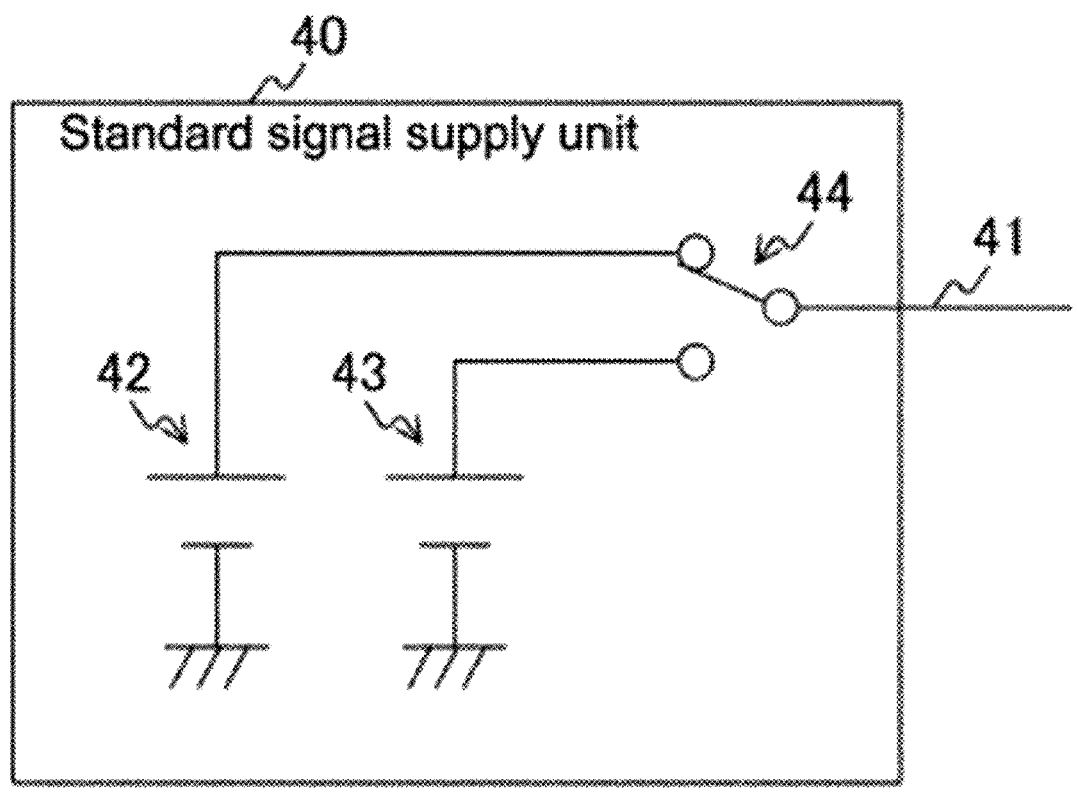

[Fig. 6]
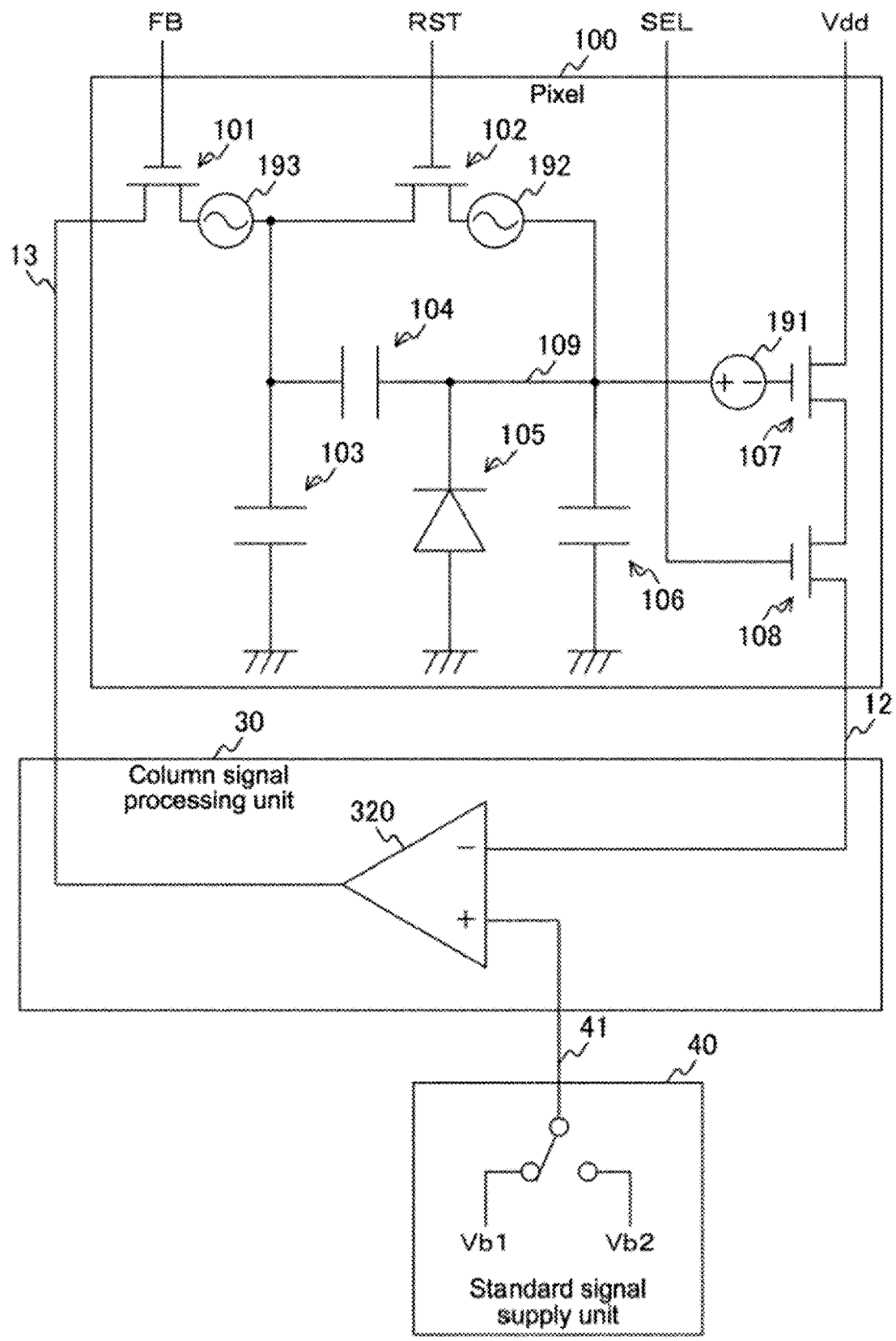

[Fig. 7]
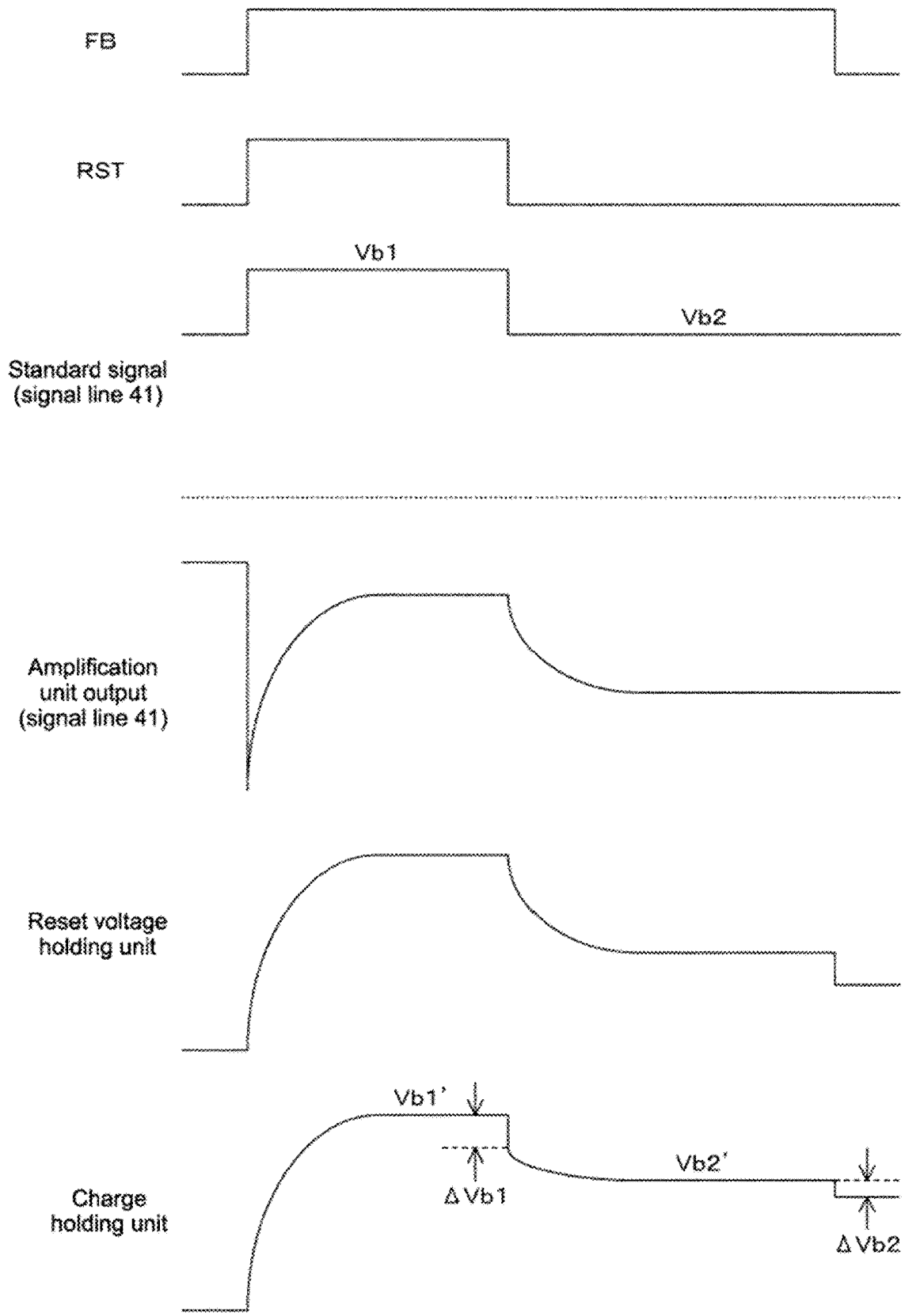

[Fig. 8]
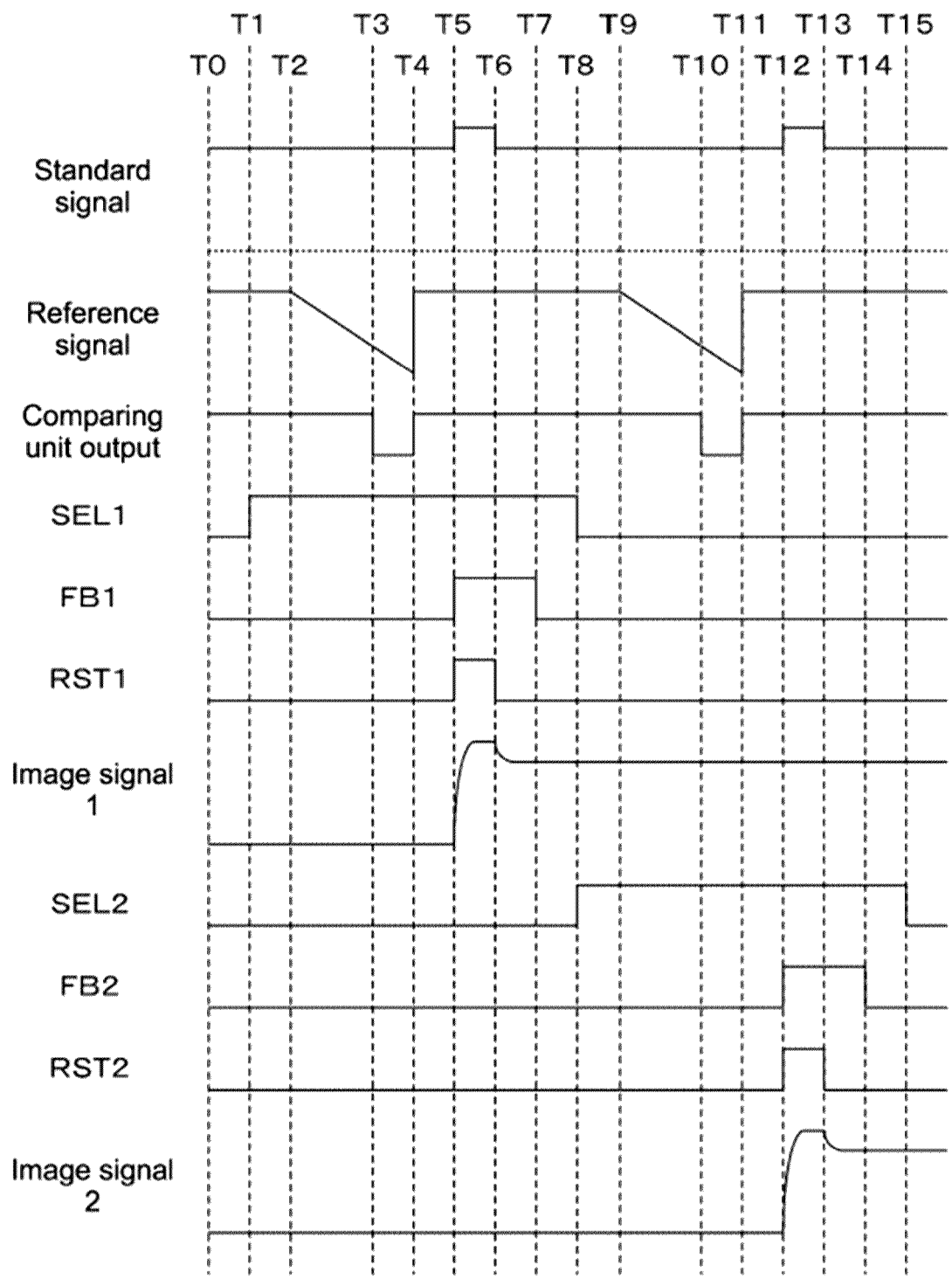

[Fig. 9]
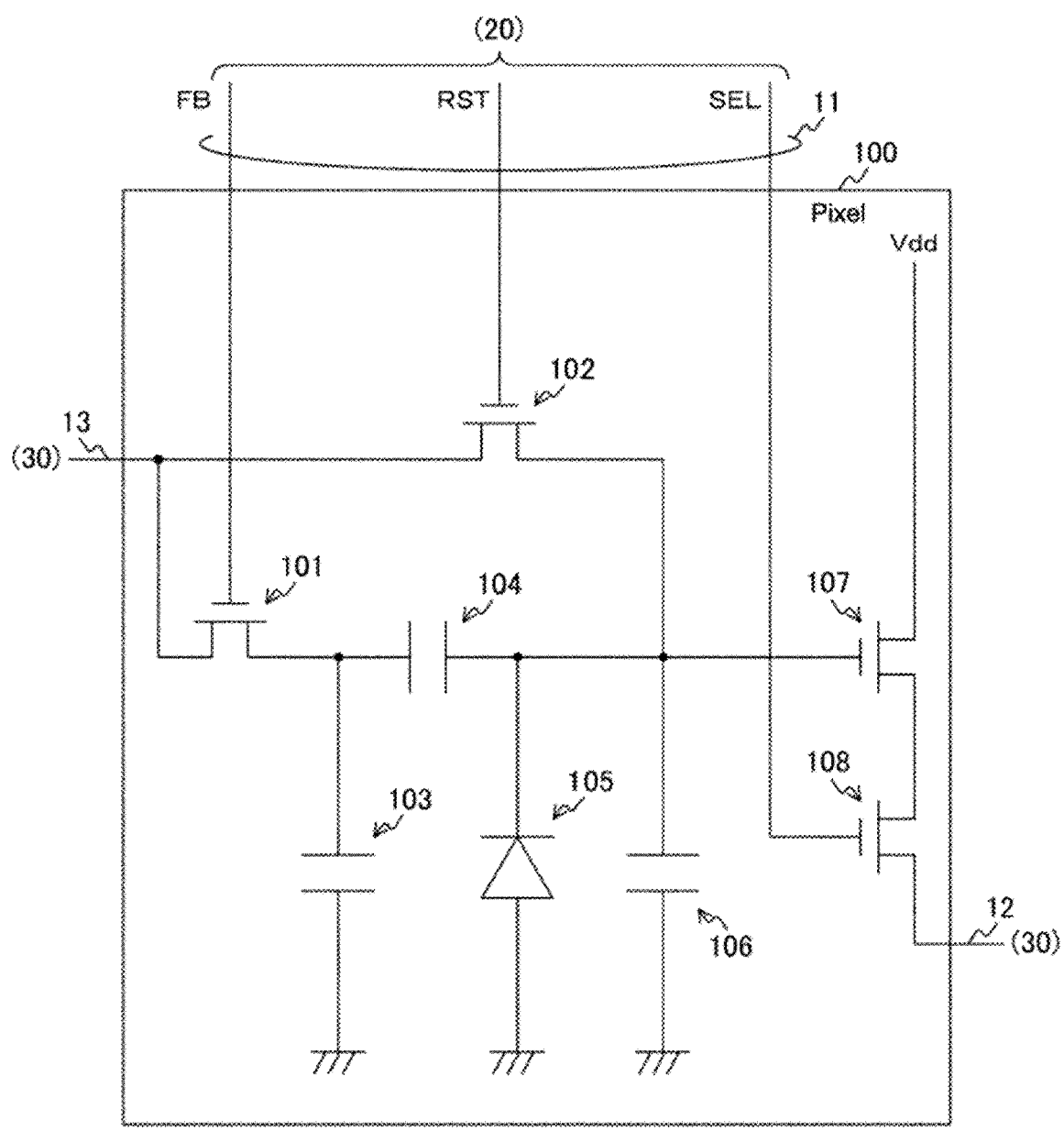

[Fig. 10]
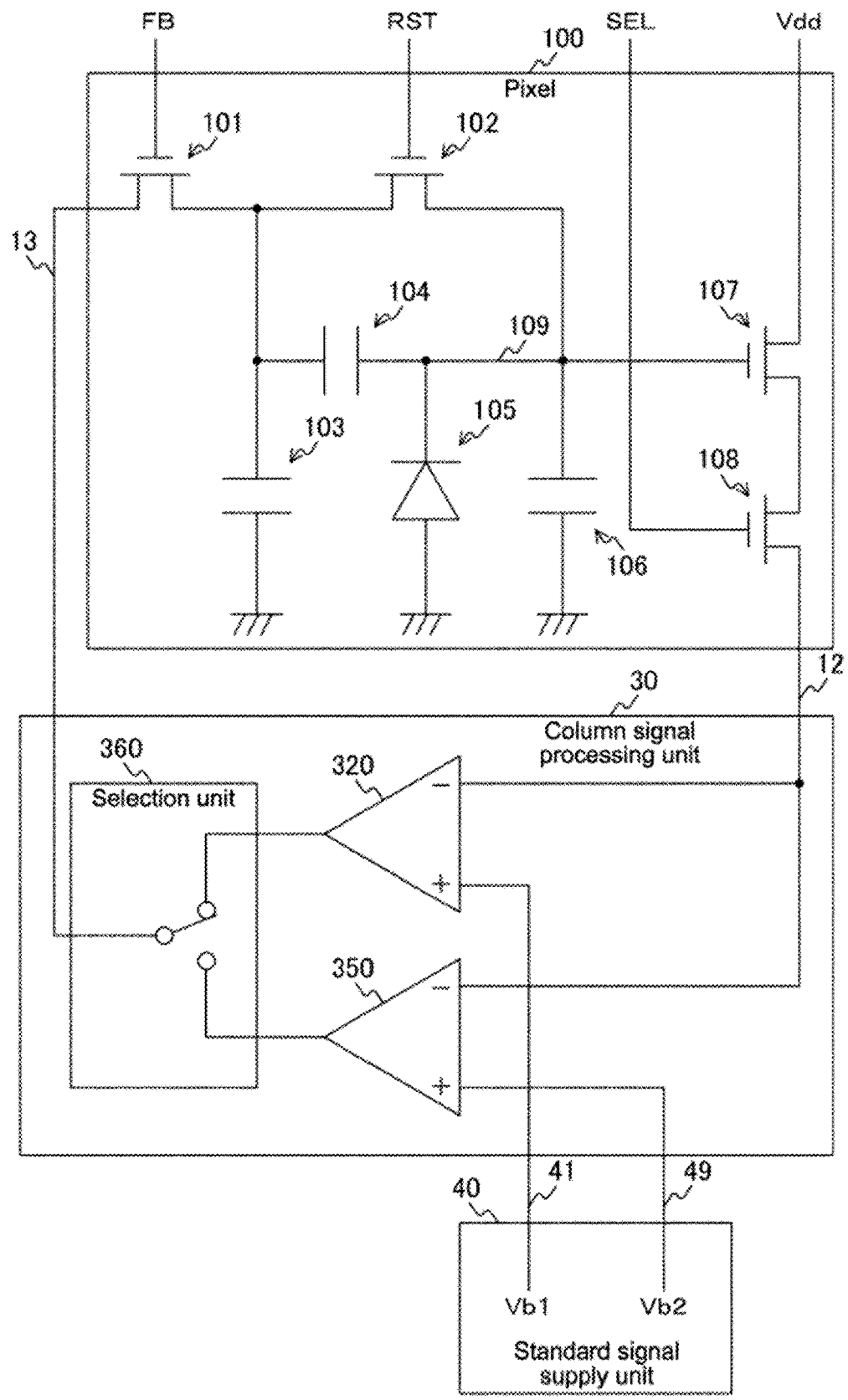

[Fig. 11]
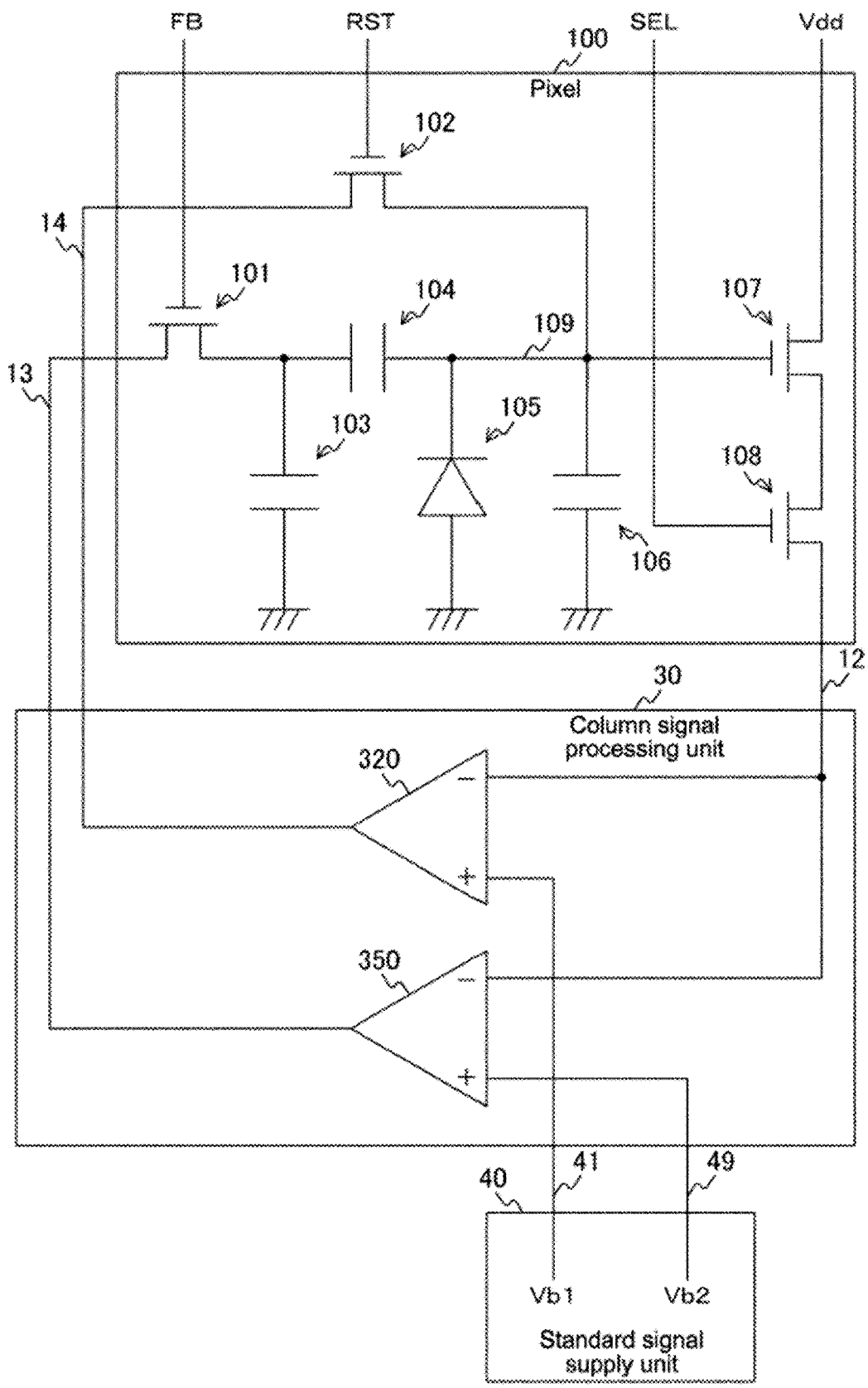

[Fig. 12]
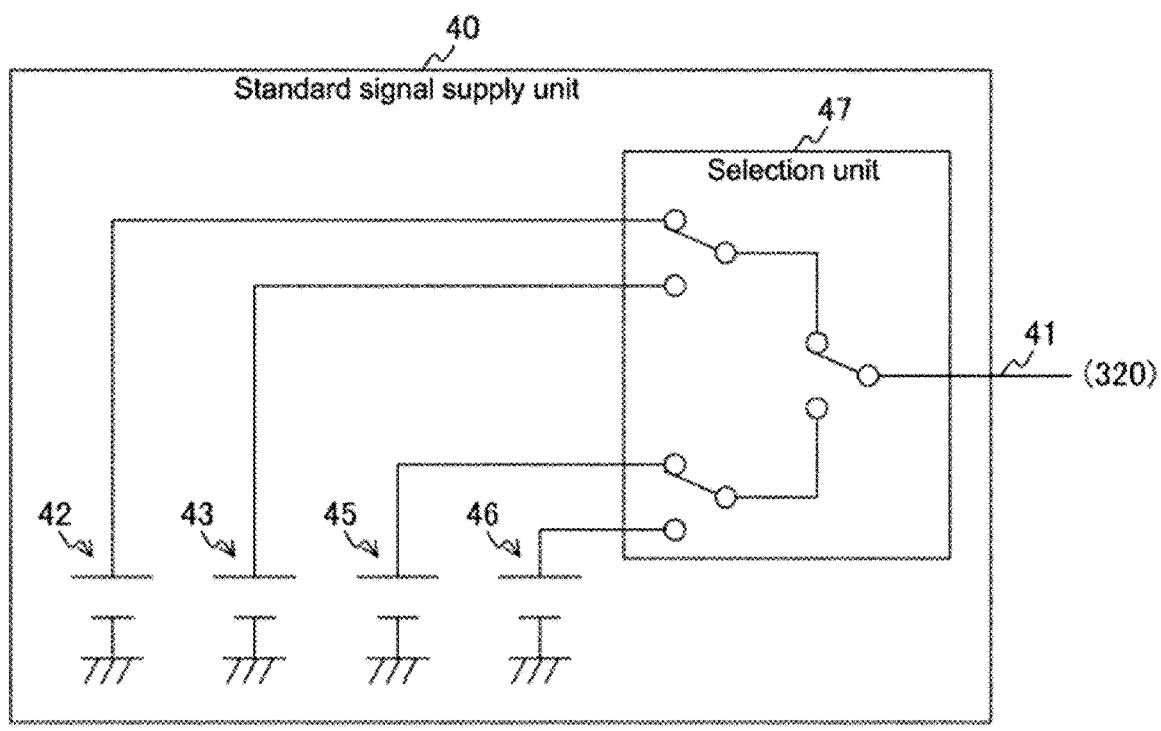

[Fig. 13]
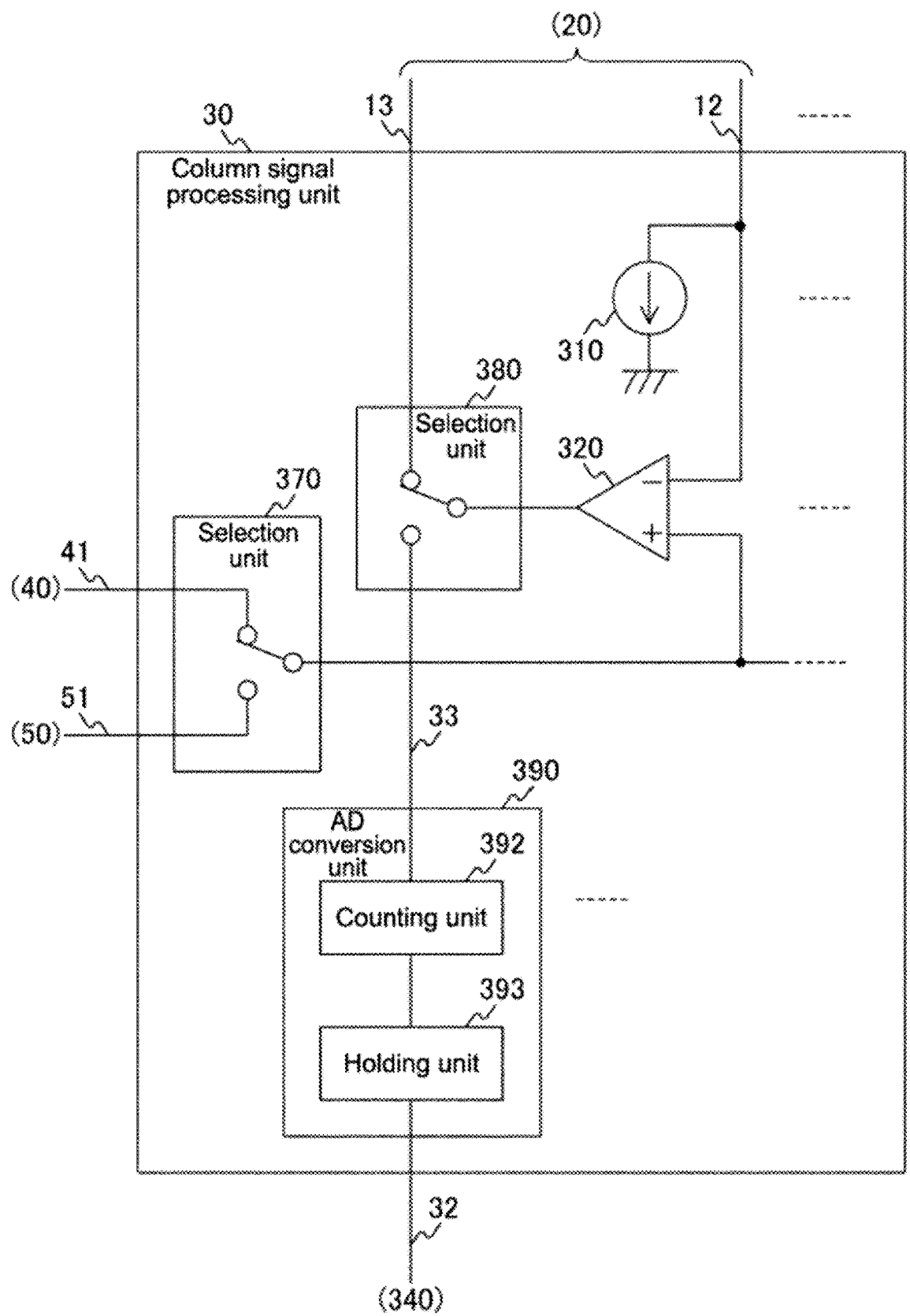

[Fig. 14]
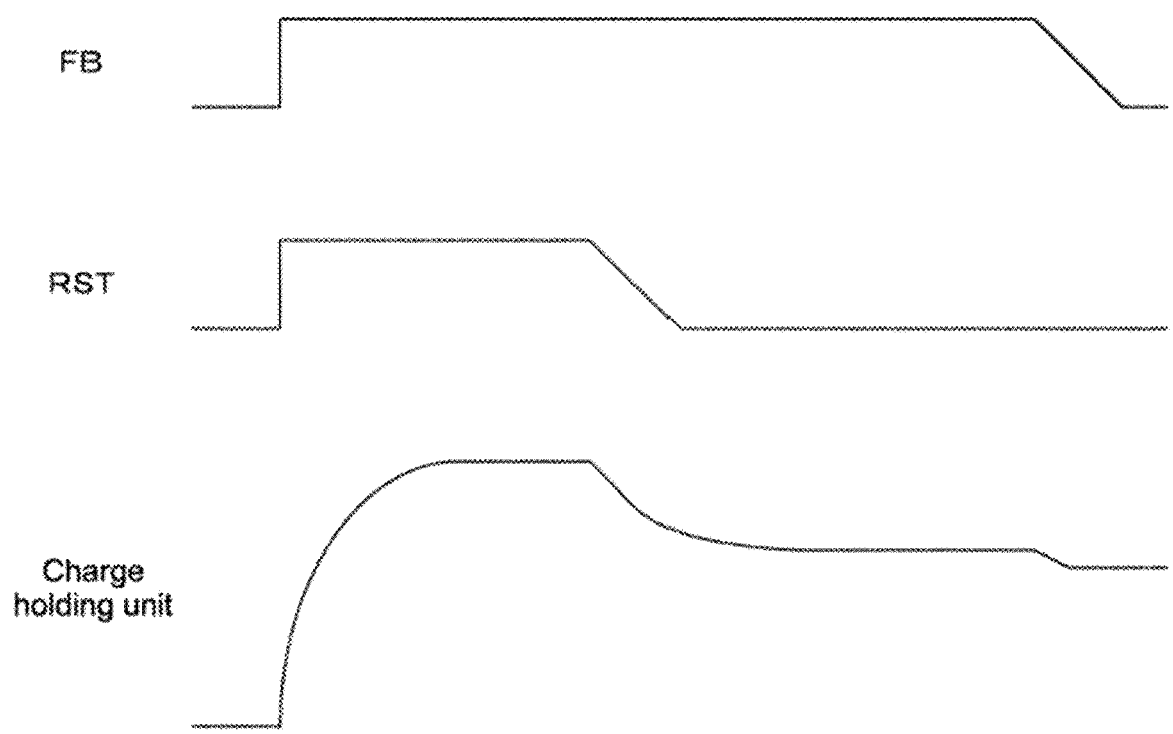

[Fig. 15]
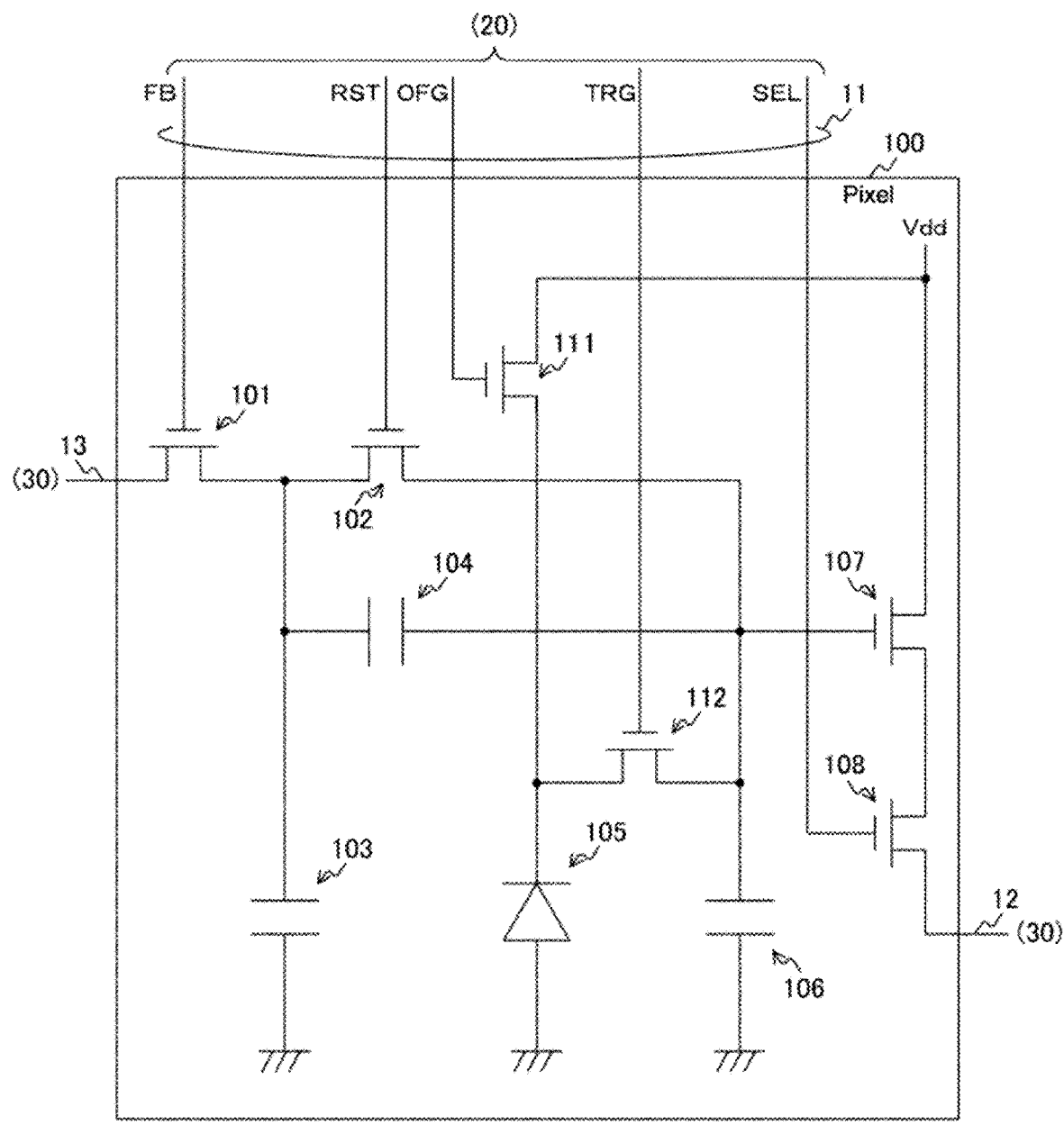

[Fig. 16]
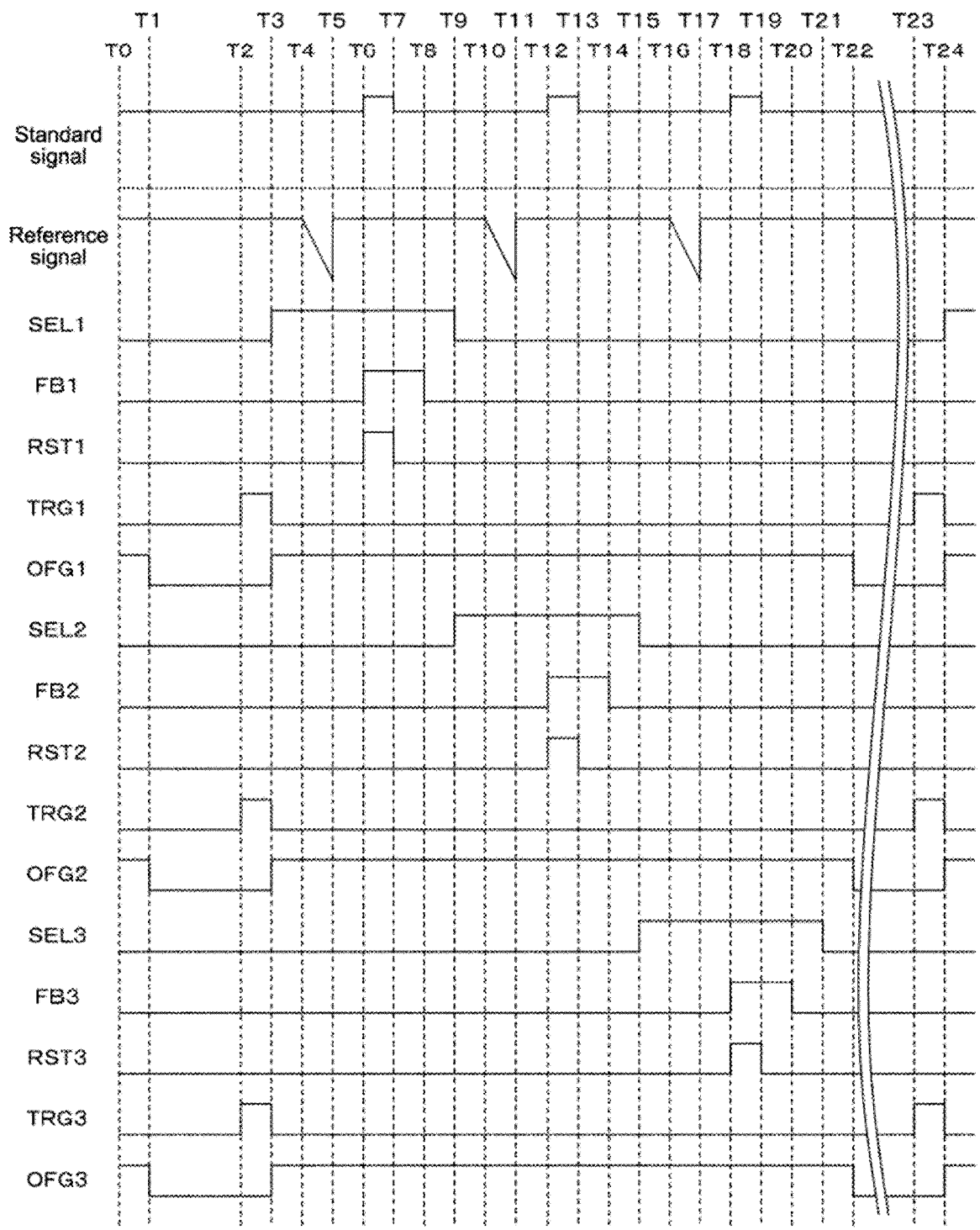

[Fig. 17]
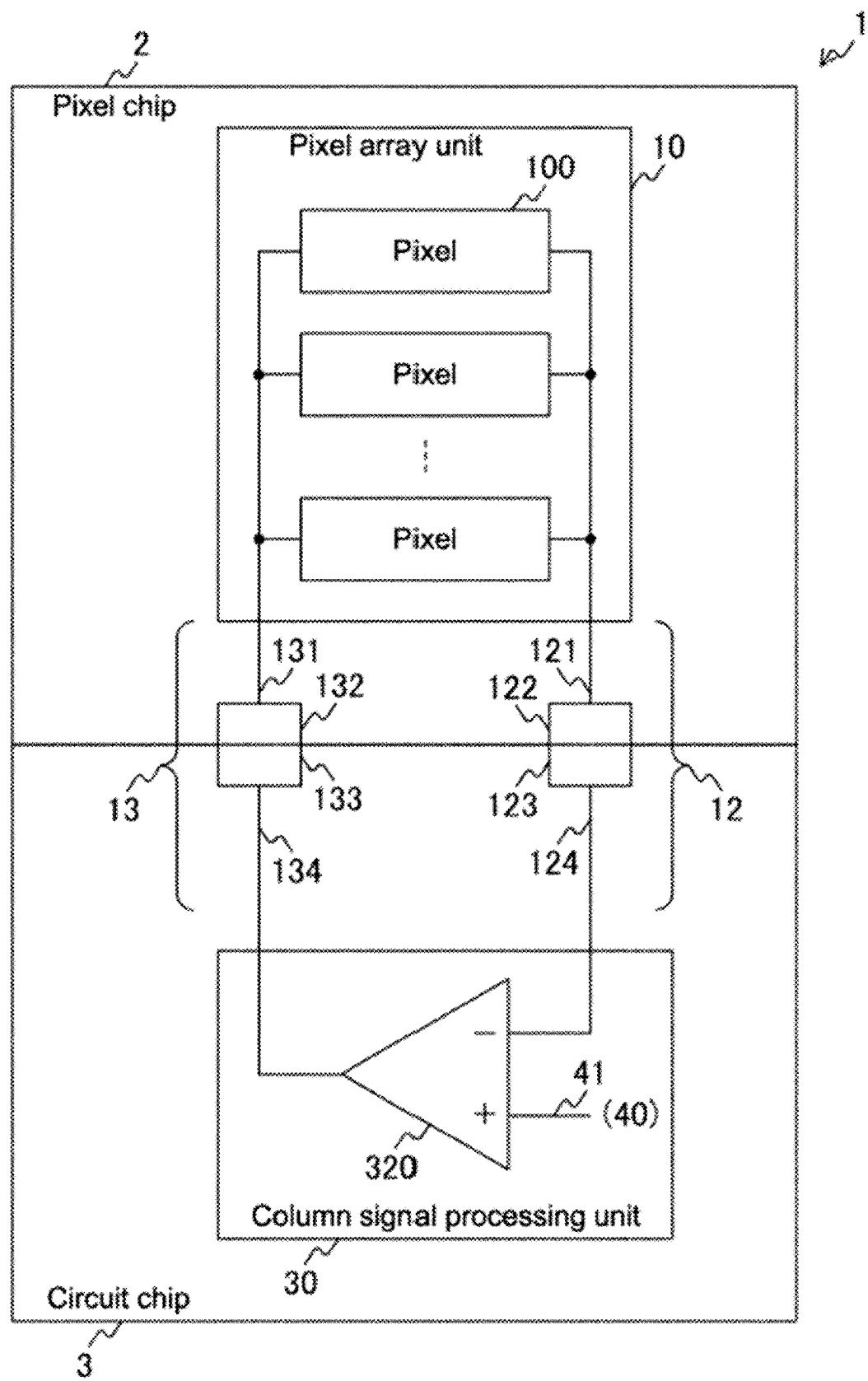

IMAGE SENSOR AND IMAGING APPARATUS

CROSS REFERENCE TO RELATED APPLICATIONS

This application claims the benefit under 35 U.S.C. § 371 as a U.S. National Stage Entry of International Application No. PCT/JP2017/036666, filed in the Japanese Patent Office as a Receiving Office on Oct. 10, 2017, which claims priority to Japanese Patent Application Number JP2016-201652, filed in the Japanese Patent Office on Oct. 13, 2016, each of which is hereby incorporated by reference in its entirety.

TECHNICAL FIELD

The present technology relates to an image sensor and an imaging apparatus. Specifically, the present technology relates to an image sensor and an imaging apparatus that reduce noise unique to the image sensor.

BACKGROUND ART

Conventionally, an image sensor employing a CMOS (Complementary Metal Oxide Semiconductor) structure is used as an image sensor. This image sensor includes pixels arranged in a two-dimensional array. When picking up an image, this image sensor causes a charge holding unit in the pixel to hold a charge generated by a photoelectric conversion element disposed in the pixel. Typically, as the charge holding unit, a floating diffusion formed in a diffusion layer of a semiconductor chip is used. This floating diffusion is connected to a charge conversion amplifier via a charge detection node. This charge conversion amplifier outputs, as an image signal in the pixel, a signal corresponding to the charge held in the floating diffusion.

It is necessary to perform resetting before this charge holding in the floating diffusion. Note that resetting is processing of discharging the charge held in the floating diffusion, and making an image signal output from the pixel equal to predetermined reference voltage, for example, voltage corresponding to a black level. The resetting can be performed by disposing a reset transistor and applying reset voltage to the floating diffusion. However, there is a problem that noise occurs when the reset transistor operates, and a part of this noise remains in the floating diffusion, causing an error in the image signal.

In this regard, a system in which an amplifier for amplifying a difference between the above-mentioned reference voltage and the image signal is disposed and the output of this amplifier is fed back to the floating diffusion via a coupling capacitor to perform resetting has been proposed (see, for example, Patent Literature 1).

CITATION LIST

Patent Literature

PTL 1: Japanese Patent Application Laid-open No. 2005-110275

SUMMARY

Some embodiments relate to an imaging device that includes a pixel, the pixel comprising: a photodetector; a control transistor; a capacitor coupled to the photodetector; a reset transistor coupled between the control transistor and the capacitor; an amplifier transistor having a gate terminal coupled to the capacitor; and a select transistor coupled to the amplifier transistor; a first signal line coupled to the select transistor; and a first amplifying circuit including a first input terminal coupled to the first signal line and a second input terminal configured to receive a first reference signal and an output terminal coupled to the control transistor.

Some embodiments relate to an electronic apparatus comprising an imaging device that includes a pixel, the pixel comprising: a photodetector; a control transistor; a capacitor coupled to the photodetector; a reset transistor coupled between the control transistor and the capacitor; an amplifier transistor having a gate terminal coupled to the capacitor; and a select transistor coupled to the amplifier transistor; a first signal line coupled to the select transistor; and a first amplifying circuit including a first input terminal coupled to the first signal line and a second input terminal configured to receive a first reference signal and an output terminal coupled to the control transistor.

Technical Problem

In the related art described above, there is a problem that since the output of the amplifier is connected via the coupling capacitor, relatively high voltage is applied to the coupling capacitor after the resetting, dark current increases, and the image quality is deteriorated.

In view of the above, it is desirable to suppress the increase in dark current to prevent the image quality from being deteriorated.

Solution to Problem

According to a first aspect of the present technology, there is provided an image sensor, including: a charge holding unit that holds a charge corresponding to irradiation light, the charge holding unit being connected to a charge detection node for detecting voltage corresponding to the held charge as an image signal; an amplification unit that outputs, as reset voltage of the charge holding unit, voltage corresponding to a difference between a standard signal serving as a reference of the image signal and the detected image signal; a reset unit that resets the charge holding unit by making the charge detection node and an output of the amplification unit conductive; a coupling capacitor that transmits the output reset voltage to the charge holding unit, the coupling capacitor being disposed between the charge detection node and the output of the amplification unit; and a standard signal supply unit that supplies the standard signal to the amplification unit where the charge detection node and the output of the amplification unit are conductive, and supplies a standard signal different from the standard signal to the amplification unit where the charge detection node and the output of the amplification unit are non-conductive. With this, an effect that voltage different from the reset voltage is output from the amplification unit in the case where the charge detection node and the output of the amplification unit are non-conductive is achieved.

Further, in this first aspect, the standard signal supply unit may supply a standard signal having voltage lower than that of the standard signal to the amplification unit where the charge detection node and the output of the amplification unit are non-conductive. With this, an effect that voltage lower than the reset voltage is output from the amplifying unit in the case where the charge detection node and the output of the amplification unit are non-conductive is achieved.

Further, in this first aspect, the image sensor may further include: a reset voltage control unit that controls transfer of the output reset voltage to the coupling capacitor, the reset voltage control unit being disposed between the output of the amplification unit and the coupling capacitor; and a reset voltage holding unit that holds the controlled reset voltage, the reset voltage holding unit being connected to the output of reset voltage control unit. With this, an effect that the transfer of the reset voltage to the coupling capacitor is controlled is achieved.

Further, in this first aspect, the amplification unit may further amplify the voltage corresponding to the difference, and change a bandwidth in the amplification unit depending on whether or not the charge detection node and the output of the amplification unit are conductive. With this, an effect that the bandwidth at the time of amplification is changed by the amplification unit depending on whether or not the charge detection node and the output of the amplification unit are conductive.

Further, in this first aspect, the image sensor may further include an image signal output unit that outputs the detected image signal, the image signal output unit being connected to the charge detection node. With this, an effect that an image signal is output by the image signal output unit is achieved.

Further, in this first aspect, the image sensor may further include: a reference signal generation unit that generates a reference signal serving as a reference for performing analog/digital conversion of the output image signal; and a holding unit that holds a digital signal corresponding to the reference signal on the basis of a result of comparing the output image signal and the generated reference signal, and outputs the held digital signal as a result of analog/digital conversion of the image signal, in which the amplification unit may further output voltage corresponding to a difference between the output image signal and the generated reference signal to the holding unit as a result of the comparison. With this, an effect that the voltage corresponding to the difference between the image signal and the standard signal and the voltage corresponding to the difference between the image signal and the reference signal are output by the amplification unit is achieved.

Further, in this first aspect, the amplification unit may amplify voltage corresponding to a difference between the output image signal and the supplied standard signal, and amplify, with a gain that is different from that in the amplification, voltage corresponding to a difference between the output image signal and the generated reference signal. With this, an effect that when amplifying the voltage corresponding to the difference between the image signal and the reference signal, the amplification is performed with a gain different from that when amplifying the voltage corresponding to the difference between the image signal and the standard signal is achieved.

According to a second aspect of the present technology, there is provided an imaging apparatus, including: a charge holding unit that holds a charge corresponding to irradiation light, the charge holding unit being connected to a charge detection node for detecting voltage corresponding to the held charge as an image signal; an amplification unit that outputs, as reset voltage of the charge holding unit, voltage corresponding to a difference between a standard signal serving as a reference of the image signal and the detected image signal; a reset unit that resets the charge holding unit by making the charge detection node and an output of the amplification unit conductive; a coupling capacitor that transmits the output reset voltage to the charge holding unit, the coupling capacitor being disposed between the charge detection node and the output of the amplification unit; a standard signal supply unit that supplies the standard signal to the amplification unit where the charge detection node and the output of the amplification unit are conductive, and supplies a standard signal different from the standard signal to the amplification unit where the charge detection node and the output of the amplification unit are non-conductive; and a processing circuit that processes the detected image signal. With this, an effect that voltage different from the reset voltage is output from the amplification unit in the case where the charge detection node and the output of the amplification unit are non-conductive.

Advantageous Effects of Invention

In accordance with the present technology, it is possible to achieve an excellent effect of suppressing the increase in dark current to prevent the image quality from being deteriorated. It should be noted that the effect described here is not necessarily limitative and may be any effect described in the present disclosure.

BRIEF DESCRIPTION OF DRAWINGS

FIG. 1 is a diagram showing a configuration example of an imaging apparatus 1 according to a first embodiment of the present technology.

FIG. 2 is a diagram showing a configuration example of a pixel 100 according to the first embodiment of the present technology.

FIG. 3 is a diagram showing a configuration example of a column signal processing unit 30 according to the first embodiment of the present technology.

FIG. 4 is a diagram showing a configuration example of an analog/digital conversion unit 330 according to the first embodiment of the present technology.

FIG. 5 is a diagram showing a configuration example of a standard signal supply unit 40 according to the first embodiment of the present technology.

FIG. 6 is a diagram showing an example of a pixel circuit according to the first embodiment of the present technology.

FIG. 7 is a diagram showing an example of a reset operation in the first embodiment of the present technology.

FIG. 8 is a diagram showing an example of image signal generation processing in the first embodiment of the present technology.

FIG. 9 is a diagram showing a configuration example of the pixel 100 according to a modified example of the first embodiment of the present technology.

FIG. 10 is a diagram showing an example of a pixel circuit according to a second embodiment of the present technology.

FIG. 11 is a diagram showing an example of a pixel circuit according to a modified example of the second embodiment of the present technology.

FIG. 12 is a diagram showing a configuration example of the standard signal supply unit 40 according to a third embodiment of the present technology.

FIG. 13 is a diagram showing a configuration example of the column signal processing unit 30 according to a fourth embodiment of the present technology.

FIG. 14 is a diagram showing an example of a control signal in a fifth embodiment of the present technology.

FIG. 15 is a diagram showing a configuration example of the pixel 100 according to a sixth embodiment of the present technology.

FIG. 16 is a diagram showing an example of image signal generation processing in a sixth embodiment of the present technology.

FIG. 17 is a diagram showing a configuration example of the imaging apparatus 1 according to a seventh embodiment of the present disclosure.

DESCRIPTION OF EMBODIMENTS

Hereinafter, embodiments for implementing the present technology (hereinafter, referred to as embodiment) will be described. Note that descriptions will be made in the following order. 1. First Embodiment (example in case of performing imaging by rolling shutter system)

2. Second Embodiment (example in case of changing gain of amplification unit)

3. Third Embodiment (example in case where reference voltage is changed depending on dynamic range)

4. Fourth Embodiment (example in case where amplification unit and comparing unit of analog/digital conversion unit are used in combination)

5. Fifth Embodiment (example in case of changing waveform of control signal)

6. Sixth Embodiment (example in case of imaging by global shutter system)

7. Seventh Embodiment (example in case of including two semiconductor chips)

1. First Embodiment

"Configuration of Imaging Apparatus"

FIG. 1 is a diagram showing a configuration example of an imaging apparatus 1 according to a first embodiment of the present technology. This imaging apparatus 1 includes a pixel array unit 10, a vertical drive unit 20, a column signal processing unit 30, a standard signal supply unit 40, and a reference signal generation unit 50.

The pixel array unit 10 generates an image signal corresponding to incident light. This pixel array unit 10 is configured by arranging pixels 100 having photoelectric conversion units in a two-dimensional matrix. Further, in the pixel array unit 10, signal lines 11 for transmitting a control signal to the pixel 100, signal lines 13 for supplying reset voltage to the pixel 100, signal lines 12 for transmitting an image signal generated by the pixel 100 are wired in an X-Y matrix. Note that the reset voltage is voltage input to the pixel 100 when resetting the pixel 100. The signal line 11 is wired for each row of the plurality of pixels 100. Further, the signal line 11 is wired in common to the pixels 100 arranged in one row. That is, control signals different for each row are input to the pixels 100, and a common control signal is input to the pixels 100 arranged in one row. Meanwhile, the signal lines 12 and 13 are wired for each column of the plurality of pixels 100. Further, the signal lines 12 and 13 are wired in common to the pixels 100 arranged in one column. That is, the image signal of the pixels 100 arranged in one column is transmitted via the common signal line 12, and the reset voltage is supplied to the pixels 100 arranged in one column via the common signal line 13. Details of the configuration of the pixel 100 will be described later.

The vertical drive unit 20 generates a control signal. This vertical drive unit 20 outputs a control signal to the pixel array unit 10 via the signal line 11.

The column signal processing unit 30 processes the image signal output from the pixel array unit 10. This image signal processed by the column signal processing unit 30 corresponds to the output signal of the imaging apparatus 1, and is output to the outside of the imaging apparatus 1. Further, this column signal processing unit generates reset voltage and outputs the reset voltage to the pixel array unit 10.

The standard signal supply unit 40 generates a standard signal. Note that the standard signal is a signal serving as a reference of the image signal generated by the pixel 100, and is, for example, a signal of voltage corresponding to a black level image signal. The generated standard signal is supplied to the column signal processing unit 30 via a signal line 41. Further, the standard signal supply unit 40 is capable of generating a plurality of different standard signals. For example, the standard signal supply unit 40 is capable of generating and supplying a first standard signal and a second standard signal having voltage of an absolute value lower than that of the first standard signal. Then, the standard signal supply unit 40 is capable of generating the first standard signal in the case where the pixel 100 is reset, and the second standard signal in other cases. Details of the configuration of the standard signal supply unit 40 will be described later.

The reference signal generation unit 50 generates a reference signal. Note that the reference signal is a signal serving as a reference when performing analog/digital conversion on the image signal generated by the pixel 100. As this reference signal, for example, a signal whose voltage drops in a ramp shape can be employed. The reference signal generation unit 50 generates a reference signal in synchronization with the start of analog/digital conversion in an analog/digital conversion unit 330 to be described later. The reference signal generation unit 50 outputs the generated reference signal to the column signal processing unit 30 via a signal line 51.

"Configuration of Pixel"

FIG. 2 is a diagram showing a configuration example of the pixel 100 according to the first embodiment of the present technology. This pixel 100 includes a photoelectric conversion unit 105, a charge holding unit 106, an image signal detection unit 107, an image signal selection unit 108, a coupling capacitor 104, a reset voltage holding unit 103, a reset unit 102, and a reset voltage control unit 101.

A MOS transistor can be used for the image signal detection unit 107, the image signal selection unit 108, the reset unit 102, and the reset voltage control unit 101. Further, the above-mentioned signal lines 11 to 13 are wired to the pixel 100. Among them, the signal line 11 includes a feedback signal line FB (feedback), a reset signal line RST (Reset), and a selection signal line SEL (Select). These signal lines are connected to the gates of the MOS transistors, and the control signals described with reference to FIG. 1 are transmitted through the signal lines. In the case where voltage equal to or higher than threshold voltage between the gate and the source of the MOS transistor (hereinafter, referred to as on-signal) is input to these signal lines, the corresponding MOS transistor is made conductive. The feedback signal line FB is a signal line for transmitting a signal for controlling supply of the reset voltage. The reset signal line RST is a signal line for transmitting a signal for controlling reset of the charge holding unit 106. The selection signal line SEL is a signal line for transmitting a signal for selecting the pixel 100. In addition to these, a power source line Vdd is wired to the pixel 100. This power source line Vdd supplies positive polarity power.

The anode of the photoelectric conversion unit 105 is grounded. The cathode of the photoelectric conversion unit 105 is connected to the gate of the image signal detection unit 107, the source of the reset unit 102, one end of the charge holding unit 106, and one end of the coupling capacitor 104. The other end of the charge holding unit 106 is grounded. The other end of the coupling capacitor 104 is connected to the drain of the reset unit 102, the source of the reset voltage control unit 101, and one end of the reset voltage holding unit 103. The other end of the reset voltage holding unit 103 is grounded. The gate of the reset unit 102 is connected to the reset signal line RST. The drain of the reset voltage control unit 101 is connected to the signal line 13, and the gate thereof is connected to the feedback signal line FB. The drain of the image signal detection unit 107 is connected to the power source line Vdd, and the source thereof is connected to the drain of the image signal selection unit 108. The gate of the image signal selection unit 108 is connected to the selection signal line SEL, and the source thereof is connected to the signal line 12.

The photoelectric conversion unit 105 generates and holds charges corresponding to irradiation light. For this photoelectric conversion unit 105, a photodiode can be used.

The charge holding unit 106 holds the charges generated by the photoelectric conversion unit 105. A floating diffusion formed in the diffusion layer of the semiconductor chip can be used for this charge holding unit 106. In the pixel 100 shown in FIG. 1, the charges generated by the photoelectric conversion unit 105 are held in the photoelectric conversion unit 105 and the charge holding unit 106.

The image signal detection unit 107 detects a signal corresponding to the charges held in the charge holding unit 106 as a pixel signal.

The image signal selection unit 108 outputs the image signal detected by the image signal detection unit 107. The image signal selection unit 108 outputs the image signal by making the image signal detection unit 107 and the signal line 12 conductive.

The reset voltage control unit 101 causes the reset voltage holding unit 103 to hold the reset voltage output from the column signal processing unit 30. This reset voltage control unit 101 causes the reset voltage holding unit 103 to hold the reset voltage by making the signal line 13 and the reset voltage holding unit 103 conductive.

The reset voltage holding unit 103 holds the reset voltage output from the reset voltage control unit 101. For example, a capacitor can be used for this reset voltage holding unit 103.

The reset unit 102 resets the charge holding unit 106. This reset unit 102 applies the reset voltage to the charge holding unit 106 by making the reset voltage holding unit 103 and the charge holding unit 106 conductive, thereby to perform resetting.

The coupling capacitor 104 transmits the reset voltage held in the reset voltage holding unit 103 to the charge holding unit 106.

Note that the image signal detection unit 107 and the image signal selection unit 108 constitute an image signal output unit.

"Configuration of Column Signal Processing Unit"

FIG. 3 is a diagram showing a configuration example of the column signal processing unit 30 according to the first embodiment of the present technology. This column signal processing unit 30 includes a constant current power supply 310, an amplification unit 320, the analog/digital conversion unit 330, and an image signal transfer unit 340. Note that the constant current power supply 310, the amplification unit 320, and the analog/digital conversion unit 330 are arranged for each column of the pixels 100 in the pixel array unit 10.

The constant current power supply 310 operates as a load of the image signal detection unit 107 described with reference to FIG. 2. The constant current power supply 310 is connected between the signal line 12 and the ground, and constitutes a source follower circuit together with the image signal detection unit 107.

The amplification unit 320 outputs the voltage corresponding to the difference between the image signal output from the pixel 100 and the standard signal output from the standard signal supply unit 40 as the reset voltage described above. This amplification unit 320 includes an inverting input terminal and a non-inverting input terminal. The signal line 12 and the signal line 41 are respectively connected to the inverting input terminal and the non-inverting input terminal. That is, the image signal and the standard signal are respectively input to the inverting input terminal and the non-inverting input terminal. Further, the amplification unit 320 outputs the reset voltage via the signal line 13. Note that the signal line 41 is wired in common to the non-inverting input terminals of all the amplification units 320 arranged in the column signal processing unit 30. As will be described later, the amplification unit 320 is capable of amplifying the voltage corresponding to the difference between the image signal and the standard signal with a predetermined gain, and outputting it as the reset voltage.

The analog/digital (AD) conversion unit 330 performs analog/digital conversion. This analog/digital conversion unit 330 converts an analog image signal into a digital image signal. The signal line 12 and the signal line 51 are wired to the analog/digital conversion unit 330, and the image signal generated by the pixel 100 and the reference signal generated by the reference signal generation unit 50 are input to the analog/digital conversion unit 330. The image signal generated by the pixel 100 is an analog signal, and is converted into a digital image signal by the analog/digital conversion unit 330. This analog/digital conversion is performed with the reference signal as a reference. The converted digital image signal is output to the image signal transfer unit 340 via the signal line 32. Note that the signal line 51 is wired in common to all the analog/digital conversion units 330 arranged in the column signal processing unit 30. Details of the configuration of the analog/digital conversion unit 330 will be described later.

The image signal transfer unit 340 transfers the digital image signal output by the analog/digital conversion unit 330. This image signal transfer unit 340 sequentially outputs the digital image signals output by the analog/digital conversion unit 330 to perform transfer. For example, this transfer can be performed in order from the digital image signal output by the analog/digital conversion unit 330 arranged at the left end in FIG. 2. The digital image signal after the transfer is output via the signal line 31. Note that the image signal transfer unit 340 is an example of a processing circuit described in the scope of claims.

"Configuration of Analog/Digital Conversion Unit"

FIG. 4 is a diagram showing a configuration example of the analog/digital conversion unit 330 according to the first embodiment of the present technology. This analog/digital conversion unit 330 includes a comparing unit 331, a counting unit 332, and a holding unit 333.

The comparing unit 331 compares the analog image signal with the reference signal, and outputs the comparison result to the counting unit 332. For example, the comparing unit 331 is capable of outputting a value "1" in the case where the voltage of the reference signal is higher than the voltage of the analog image signal, and a value "0" in the case where the voltage of the reference signal is lower than the voltage of the analog image signal.

The counting unit 332 measures the time from the start of analog/digital conversion in the analog/digital conversion unit 330. This measurement can be performed by counting clock signals (not shown). This counting is started together with the start of analog/digital conversion, and is stopped on the basis of the comparison result from the comparing unit 331. Specifically, in the case where the output of the comparing unit 331 transits from the value "1" to "0", the counting unit 332 is capable of stopping counting. In this case, the counting unit 332 stops the counting when the analog image signal and the reference signal are substantially equal. As described above, since the reference signal is generated in synchronization with the start of analog/digital conversion, the count value of the counting unit 332 is a digital value corresponding to the voltage of the reference signal. The counting unit 332 outputs the count value when the counting is stopped to the holding unit 333.

The holding unit 333 holds the count value output from the counting unit 332 as a digital image signal generated as a result of analog/digital conversion. This holding unit 333 outputs the held digital image signal to the image signal transfer unit 340.

"Configuration of Standard Signal Supply Unit"

FIG. 5 is a diagram showing a configuration example of the standard signal supply unit 40 according to the first embodiment of the present technology. This standard signal supply unit 40 includes voltage sources 42 and 43 and a selection unit 44.

The voltage sources 42 and 43 respectively generate the first standard signal and the second standard signal. As described above, the second standard signal is a signal having voltage of an absolute value lower than that of the first standard signal.

The selection unit 44 selects either the first standard signal generated by the voltage source 42 or the second standard signal generated by the voltage source 43, and outputs the selected signal to the signal line 41. This selection unit 44 selects the first standard signal in the case where the output of the reset voltage control unit 101 and the charge holding unit 106 are made conductive by the reset unit 102 described with reference to FIG. 2. In other cases, the second standard signal is selected.

"Pixel Circuit"

FIG. 6 is a diagram showing an example of a pixel circuit according to the first embodiment of the present technology. FIG. 6 describes a reset operation in a circuit including the pixel 100, the amplification unit 320, and the standard signal supply unit 40.

In FIG. 6, a node to which a terminal that is not grounded among two terminals of the charge holding unit 106 is connected is referred to as charge detection node 109. This charge detection node 109 corresponds to a node for detecting voltage corresponding to the charge held in the charge holding unit 106. The gate of the image signal detection unit 107 is connected to the charge detection node 109, and detects voltage corresponding to the charge held in the charge holding unit 106 as an image signal. Specifically, when the voltage of the charge detection node 109 is equal to or higher than a threshold value Vth between the gate and the source of the image signal detection unit 107, the image signal detection unit 107 is turned on, and voltage obtained by subtracting the threshold value Vth from the voltage of the charge detection node is output to the source terminal as an image signal. This image signal is output via the signal line 12 by the image signal selection unit 108. In FIG. 6, the threshold value Vth is represented by a potential difference 191. Even at the time of resetting, a difference corresponding to the threshold value Vth is generated between the voltage of the charge detection node 109 and the image signal. Since this threshold value Vth changes under the influence of the ambient temperature or the like, the image signal at the time of resetting includes an error.

In this regard, by placing the amplification unit 320 and feeding back the difference between the image signal output from the pixel 100 and the standard signal supplied from the standard signal supply unit 40 to the charge detection node 109, an error due to the threshold value Vth can be reduced. In FIG. 6, a feedback path is formed by making the reset voltage control unit 101 and the reset unit 102 conductive, and the voltage corresponding to the difference between the image signal and the standard signal is fed back to the charge detection node 109 as the reset voltage. At this time, the amplification unit 320 amplifies the voltage corresponding to the difference between the image signal and the standard signal with a predetermined gain, and outputs it as the reset voltage, thereby making it possible to increase the gain (loop gain) circulating the feedback path. As a result, it is possible to improve the effect of reducing the error due to the threshold value Vth.

Further, at the time of resetting, noise called kTC noise remains in the charge holding unit 106. This noise is noise caused by the operation of the reset unit 102 and occurs when the state of the reset unit 102 shifts from the conduction state to the non-conduction state. Then, a part thereof remains in the charge holding unit 106. In FIG. 6, this noise is represented by the signal source 192. Noise remaining in the charge holding unit 106 can be expressed by the following formula.

$$Qn^2=kTC$$

Note that Qn represents a noise charge. k represents the Boltzmann constant. T represents temperature. C represents the electrostatic capacity of the charge holding unit 106. As described above, by reducing an electrostatic capacity C of the charge holding unit 106, kTC noise charges can be reduced. However, since the electrostatic capacity C depends on the parasitic capacity of the node, it is difficult to change it. Further, in the case where the electrostatic capacity C is reduced, the charge holding capacity is reduced, and the dynamic range of the pixel 100 is reduced.

In this regard, the coupling capacitor 104 and the reset voltage holding unit 103 connected in series are connected in parallel with the charge holding unit 106. As a result, the charge generated by the photoelectric conversion unit 105 is held in the capacitor obtained by combining these three capacitors, and the kTC noise can be reduced. For example, the reset voltage holding unit 103 can have the same electrostatic capacity as that of the charge holding unit 106. Further, the coupling capacitor 104 can have a smaller electrostatic capacity than the charge holding unit 106, for example.

In the pixel circuit having such a configuration, the reset operation can be performed as follows. First, the image signal selection unit 108 is made conductive. Next, the reset voltage control unit 101 and the reset unit 102 are made conductive, and the standard signal supply unit 40 is caused to supply the first standard signal (Vb1). As a result, the reset voltage based on the first standard signal Vb1 is applied to the charge holding unit 106 and, the charge holding unit 106 is reset. After that, the reset unit 102 is made non-conductive. Noise (the signal source 192) remains in the charge holding unit 106, the reset voltage holding unit 103, and the coupling capacitor 104. However, since the feedback path is maintained via the coupling capacitor 104, noise remaining in the charge holding unit 106 is removed. After that, by making the reset voltage control unit 101 non-conductive, the feedback path is released, and exposure and generation of an image signal can be performed.

When making the reset voltage control unit 101 non-conductive, noise caused by the operation of the reset voltage control unit 101 occurs. In FIG. 6, this noise is represented by a signal source 193. Noise (signal source 193) also remains in the charge holding unit 106, the reset voltage holding unit 103, and the coupling capacitor 104. However, by reducing the electrostatic capacity of the coupling capacitor 104 than that of the charge holding unit 106, noise divided into the charge holding unit 106 can be reduced. As described above, in the pixel circuit shown in FIG. 6, the influence of the error caused by Vth and the kTC noise can be reduced.

By reducing the electrostatic capacity of the coupling capacitor 104 than the electrostatic capacity of the charge holding unit 106 as described above, noise remaining in the charge holding unit 106 can be reduced. However, when the electrostatic capacity of the coupling capacitor 104 is smaller than the electrostatic capacity of the charge holding unit 106, it is necessary to increase the output voltage of the amplification unit 320. This is because the voltage applied to the coupling capacitor 104 among the output voltage of the amplification unit 320 is increased. Therefore, it is necessary to increase the dynamic range of the amplification unit 320. In this regard, when the state of the reset unit 102 shifts from the conduction state to the non-conduction state, the standard signal supply unit 40 is caused to supply the second standard signal Vb2 having voltage of an absolute value lower than that of the above-mentioned first standard signal Vb1, and voltage based on the second standard signal Vb2 is fed back to the charge detection node 109.

That is, when the reset voltage based on the first standard signal Vb1 is output from the amplification unit 320, the coupling capacitor 104 is short-circuited by the reset unit 102. When the reset unit 102 enters the non-conduction state, voltage based on the second standard signal Vb2, which is lower than the first standard signal Vb1, is output from the amplification unit 320. As a result, it is possible to prevent the increase in the dynamic range required for the amplification unit 320.

Further, in addition to the charge generated by photoelectric conversion, a charge generated due to factors other than photoelectric conversion flows into the charge holding unit 106. This charge inflow is called dark current, becomes an error, and is superimposed on the image signal. This dark current is proportional to the voltage applied inside the pixel 100. By holding the voltage based on the second standard signal in the reset voltage holding unit 103 and the coupling capacitor 104 as described above, the voltage of the reset voltage holding unit 103 and the like can be lowered, and the influence of the dark current can be reduced.

"Reset Operation"

FIG. 7 is a diagram showing an example of the reset operation in the first embodiment of the present technology. In FIG. 7, FB and RST represent control signals input to the pixel 100 through the feedback signal line FB and the reset signal line RST, respectively. Of these binarized waveforms, the value "1" represents input of the on-signal. Further, the standard signal represents the standard signal supplied from the standard signal supply unit 40. In this standard signal, broken lines represent the level of 0 V in the standard signal. Further, the amplification unit output represents the output voltage waveform of the amplification unit 320. The reset voltage holding unit and the charge holding unit represent voltage waveforms applied to the reset voltage holding unit 103 and the charge holding unit 106, respectively. Note that in FIG. 7, it is assumed that the image signal selection unit 108 is conductive.

First, the on-signal is input from the feedback signal line FB and the reset signal line RST, and the reset voltage control unit 101 and the reset unit 102 are made conductive. At the same time, the first standard signal Vb1 is supplied from the standard signal supply unit 40. As a result, the amplification unit 320 outputs the reset voltage based on the first standard signal Vb1. Since the reset unit 102 is conductive, voltage (Vb1') substantially the same as the reset voltage holding unit 103 is applied to the charge holding unit 106. This voltage corresponds to the reset voltage, and has a value substantially equal to the voltage obtained by superimposing the threshold value Vth on the first standard signal Vb1.

Next, the input of the on-signal from the reset signal line RST is stopped, and the second standard signal Vb2 is supplied from the standard signal supply unit 40. At this time, noise caused by the operation of the reset unit 102 occurs. In FIG. 7, an example where the voltage of the charge holding unit 106 is reduced by ΔVb1 due to the influence of this noise is shown. However, since the reset voltage control unit 101 is conductive, Vb2', which is voltage based on the second standard signal Vb2, is applied to the charge holding unit 106 via the coupling capacitor 104. Voltage lower than this Vb2' is applied to the reset voltage holding unit 103. Next, the input of the on-signal from the feedback signal line FB is stopped, and the reset voltage control unit 101 is made non-conductive. At this time, due to the influence of noise caused by the operation of the reset voltage control unit 101, the voltage of the charge holding unit 106 is reduced by ΔVb2. Due to the effect of the coupling capacitor 104, this ΔVb2 becomes lower than ΔVb1.

In this way, the reset operation in the first embodiment of the present technology can be performed. By making the reset unit 102 non-conductive and supplying the second standard signal Vb2 to the amplification unit 320, the voltage of the charge holding unit 106 after resetting changes to Vb2'. In this case, the second standard signal is made to be an image signal corresponding to the black level in the pixel 100. That is, at the time of resetting, the resetting is performed by reset voltage higher than the voltage corresponding to the black level in the pixel 100.

"Image Signal Generation Processing"

FIG. 8 is a diagram showing an example of image signal generation processing in the first embodiment of the present technology. FIG. 8 shows the image signal generation processing of the pixels 100 arranged in the first row and the second row in the pixel array unit 10. In FIG. 8, the standard signal represents the standard signal supplied from the standard signal supply unit 40. In this standard signal, broken lines represent the potential of 0 V of the standard signal. The reference signal represents the reference signal generated by the reference signal generation unit 50 described with reference to FIG. 1. The comparing unit output represents the output of the comparing unit 331 described with reference to FIG. 4. SEL, FB, and RST represent control signals input through the selection signal line SEL, the feedback signal line FB, and the reset signal line RST, respectively. Since different control signals are input for each row, they are distinguished by adding line numbers. For example, SEL1 and SEL2 represent control signals input by the selection signal line SEL wired to the pixels 100 of the first row and the second row, respectively. Further, similarly to FIG. 7, the value "1" represents input of the on-signal. The image signals each represent the waveform of the image signal output from the pixel 100. These image signals are also distinguished by adding line numbers.

In the period from T0 to T1, the standard signal supply unit 40 supplies the second standard signal Vb2. The supply of the second standard signal Vb2 continues until T5. This period corresponds to the initial state, and the input of the on-signal to all the signal lines is stopped. Further, in this period, the charge generated by the photoelectric conversion unit 105 is held in the charge holding unit 106.

In the period from T1 to T5, the on-signal is input from a selection signal line SEL1, the image signal selection units 108 of the pixels 100 arranged in the first row are made conductive, and an image signal corresponding to the charge held in the charge holding unit 106 is output (T1). Note that the input of the on-signal to the selection signal line SEL1 continues until T8. Next, the reference signal generation unit 50 starts generation of the reference signal (T2). Next, when the voltage of the reference signal becomes lower than the voltage of the image signal, the output of the comparing unit 331 transits from the value "1" to "0" (T3). Next, the reference signal generation unit 50 stops the generation of the reference signal (T4). After that, the digital image signal is held in the holding unit 333 described with reference to FIG. 4.

In the period from T5 to T6, the on-signal is input from a feedback signal line FB1 and a reset signal line RST1, and the reset voltage control unit 101 and the reset unit 102 are made conductive. At the same time, the standard signal supply unit 40 supplies the first standard signal Vb1. As a result, resetting is performed in the pixels 100 arranged in the first row, and the voltage of the image signal increase. Note that the input of the on-signal to the feedback signal line FB1 continues until T7.

In the period from T6 to T7, the input of the on-signal to the reset signal line RST1 is stopped. At the same time, the standard signal supply unit 40 supplies the second standard signal Vb2. As a result, the image signal changes to voltage based on the second standard signal Vb2. Note that the supply of the second standard signal Vb2 of the standard signal supply unit 40 continues until T12.

In the period from T7 to T8, the input of the on-signal to the feedback signal line FB1 is stopped. As a result, new exposure is started in the pixels 100 arranged in the first row, and the charge generated by the photoelectric conversion unit 105 is held in the charge holding unit 106.

In the period from T8 to T15, the input of the on-signal to the selection signal line SEL1 is stopped, and the on-signal is input to a selection signal line SEL2 (T8). After that, the same processing as the processing in the period from T1 to T8 is performed in the pixels 100 arranged in the second row.

By performing the processing on the pixels 100 arranged in all the rows of the pixel array unit 10, a frame, which is an image signal corresponding to one screen, can be generated. As described above, an imaging method in which exposure, resetting, and output of the image signal are sequentially performed for each row is referred to as a rolling shutter system.

As described above, in the first embodiment of the present technology, by outputting voltage lower than the reset voltage to the pixel 100 from the amplification unit 320 after resetting the pixel 100, voltage applied to the reset voltage holding unit 103 and the coupling capacitor 104 is reduced. As a result, it is possible to suppress the increase in dark current to prevent the image quality from being deteriorated.

Modified Example

In the first embodiment described above, the reset voltage is supplied via the reset voltage control unit 101 and the reset unit 102. Meanwhile, a modified example of the first embodiment of the present technology is different from the first embodiment in that the reset voltage is directly supplied to the reset unit 102.

"Configuration of Pixel"

FIG. 9 is a diagram showing a configuration example of the pixel 100 according to the modified example of the first embodiment of the present technology. The pixel 100 in FIG. 9 is different from the pixel 100 described with reference to FIG. 2 in that the drain of the reset unit 102 is connected to the signal line 13. Since the reset voltage is supplied to the reset unit 102 without passing through the reset voltage control unit 101, the equivalent resistance of a path transmitting the reset voltage can be reduced, and the time required for resetting can be reduced.

As described above, in accordance with the modified example of the first embodiment of the present technology, since the reset voltage is directly applied to the drain of the reset unit 102, the time required for resetting can be reduced.

2. Second Embodiment

In the first embodiment described above, the reset voltage or the like is output to the pixel 100 by using the single amplification unit 320. Meanwhile, resetting or the like may be performed by using a plurality of amplifiers having different bandwidths. The second embodiment of the present technology is different from the first embodiment in that two amplifiers are used.

"Pixel Circuit"

FIG. 10 is a diagram showing an example of a pixel circuit according to the second embodiment of the present technology. The pixel circuit shown in FIG. 10 is different from the pixel circuit described with reference to FIG. 6 in the following points. The column signal processing unit 30 shown in FIG. 10 further includes an amplification unit 350 and a selection unit 360. The amplification unit 350 amplifies the difference between the image signal and the standard signal in a bandwidth different from that of the amplification unit 320. Further, the selection unit 360 selects one of the amplification units 320 and 350, and transmits the output of the selected amplification unit to the signal line 13. Further, the standard signal supply unit 40 shown in FIG. 10 supplies the first standard signal Vb1 to the non-inverting input terminal of the amplification unit 320 and the second standard signal Vb2 to the non-inverting input terminal of the amplification unit 350.

The reset operation in the pixel circuit shown in FIG. 10 can be performed as follows. First, the reset voltage control unit 101 and the reset unit 102 are made conductive. At the same time, the selection unit 360 transmits the output of the amplification unit 320 to the signal line 13. As a result, the reset voltage based on the first standard signal Vb1 is output from the amplification unit 320 and applied to the charge holding unit 106. After that, the reset unit 102 is made non-conductive. At the same time, the selection unit 360 transmits the output of the amplification unit 350 to the signal line 13. As a result, voltage based on the second standard signal Vb2 is output from the amplification unit 350 and applied to the charge holding unit 106 via the coupling capacitor 104.

When the reset voltage based on the first standard signal Vb1 is applied to the charge holding unit 106, the reset unit 102 is made conductive to short-circuit the coupling capacitor 104, so that the gain (loop gain) of the feedback path increases. Therefore, when the reset voltage based on the first standard signal Vb1 is applied to the charge holding unit 106, by narrowing the bandwidth of the amplification unit, the operation of the amplification unit can be stabilized. Meanwhile, when voltage based on the second standard signal Vb2 is applied to the charge holding unit 106, the reset unit 102 enters the non-conduction state, so that the output voltage of the amplification unit is divided by the coupling capacitor 104 and the charge holding unit 106. For this reason, the loop gain is reduced and the settling time increases. In this regard, when voltage based on the second standard signal Vb2 is applied to the charge holding unit 106, the settling time can be reduced by widening the bandwidth of the amplification unit.

In the second embodiment of the present technology, the two amplification units 320 and 350 having different bandwidths are arranged, and one of them is selected and used. Then, the bandwidth of the amplification unit 320 is narrowed, and the bandwidth of the amplification unit 350 is widened. As a result, when applying the reset voltage, the stability of the amplification unit can be improved. Further, when applying voltage based on the second standard signal Vb2, the settling time can be reduced.

Since the configuration of the imaging apparatus 1 other than this is similar to that of the imaging apparatus 1 described in the first embodiment of the present technology, the description thereof will be omitted.

As described above, in the second embodiment of the present technology, two amplification units having different bandwidths are selected and the reset voltage or the like is applied to the charge holding unit 106. As a result, it is possible to improve the stability at the time of resetting, reduce the settling time, and reduce the time required for imaging.

"Modified Example"

In the second embodiment described above, the selection unit 360 selects the outputs of the amplification unit 320 and 350. Meanwhile, in a modified example of the second embodiment of the present technology, the outputs of the amplification unit 320 and 350 are individually wired to the pixels 100. It is different from the second embodiment in that the selection unit 360 is not required.

"Pixel Circuit"

FIG. 11 is a diagram showing an example of a pixel circuit according to the modified example of the second embodiment of the present technology. As compared with the pixel circuit described with reference to FIG. 10, the pixel circuit shown in FIG. 10 does not need to include the selection unit 360. Further, the output of the amplification unit 320 shown in FIG. 10 is connected to the drain of the reset unit 102 via a signal line 14, and the output of the amplification unit 350 is connected to the drain of the reset voltage control unit 101 via the signal line 13.

As described above, in accordance with the modified example of the second embodiment of the present technology, it is possible to supply the outputs of the amplification units 320 and 350 to the pixels 100 without providing the selection unit 360, and simplify the configuration of the imaging apparatus 1.

3. Third Embodiment

In the first embodiment described above, the reset voltage or the like based on the first reference voltage and the second reference voltage is applied to the charge holding unit 106. Meanwhile, the reference voltage may be changed depending on the dynamic range required for the pixel 100, and the reset voltage or the like may be changed. A third embodiment of the present technology is different from the first embodiment in that the reset voltage is changed depending on the dynamic range.

"Configuration of Standard Signal Supply Unit"

FIG. 12 is a diagram showing a configuration example of the standard signal supply unit 40 according to the third embodiment of the present technology. The standard signal supply unit 40 shown in FIG. 12 is different from the standard signal supply unit 40 described with reference to FIG. 5 in the following points. The standard signal supply unit 40 shown in FIG. 12 includes a selection unit 47 instead of the selection unit 44. Further, the standard signal supply unit 40 shown in FIG. 12 further includes voltage sources 45 and 46.

The voltage sources 45 and 46 generate a third reference signal and a fourth reference signal, respectively. The third standard signal and the fourth standard signal are signals corresponding to the first standard signal and the second standard signal, respectively. That is, the fourth standard signal is a signal having voltage of an absolute value lower than that of the third standard signal. Meanwhile, the third standard signal and the fourth standard signal are signals having voltage of absolute values lower than those of the first standard signal and the second standard signal, respectively.

The selection unit 47 selects one of standard signals generated by the voltage sources 42, 43, 45, and 46, and outputs the selected signal to the signal line 41. This selection unit 47 operates as follows. The selection unit 47 selects the first standard signal and the second standard signal and supplies the selected signals to the amplification unit 320 in the case where a wide dynamic range is required for the imaging apparatus 1. As a result, relatively high reset voltage is applied, and it is possible to suppress saturation of the pixel and achieve a wide dynamic range. Meanwhile, in the case where a wide dynamic range is not required, the selection unit 47 selects the third standard signal and the fourth standard signal and supplies the selected signals to the amplification unit 320. As a result, relatively low reset voltage can be applied, and the dark current can be reduced. Therefore, in the case where imaging is performed in a low illuminance environment, the image quality can be improved.

Since the configuration of the imaging apparatus 1 other than this is similar to that of the imaging apparatus 1 described in the first embodiment of the present technology, the description thereof will be omitted.

As described above, in accordance with the third embodiment of the present technology, by selecting the standard signal and supplying the selected signal to the amplification unit 320 to change the reset voltage, it is possible to achieve the characteristics corresponding to the required dynamic range and improve the user's convenience.

4. Fourth Embodiment

In the first embodiment described above, the comparing unit 331 compares the image signal and the reference signal in the analog/digital conversion unit 330. However, this comparison may be performed by the amplification unit 320. A fourth embodiment of the present technology is different from the first embodiment in that the amplification unit 320 further compares the image signal and the reference signal in the analog/digital conversion.

"Configuration of Column Signal Processing Unit"

FIG. 13 is a diagram showing a configuration example of the column signal processing unit 30 according to the fourth embodiment of the present technology. The column signal processing unit 30 shown in FIG. 13 is different from the column signal processing unit 30 described with reference to FIG. 3 in the following points. The column signal processing unit 30 in FIG. 13 includes an analog/digital conversion unit 390 instead of the analog/digital conversion unit 330. Further, the column signal processing unit 30 shown in FIG. 13 further includes selection units 370 and 380.

The analog/digital conversion unit 390 includes a counting unit 392 and a holding unit 393. The configurations of these units can be similar to those of the counting unit 332 and the holding unit 333 described with reference to FIG. 4. Note that the counting unit 392 is connected to the selection unit 380 via a signal line 33.

The selection unit 370 selects either the standard signal output from the standard signal supply unit 40 or the reference signal output from the reference signal generation unit 50, and inputs the selected signal to the non-inverting input terminal of the amplification unit 320. This selection unit 370 selects the standard signal when performing the reset operation in the pixel 100 and selects the reference signal when performing analog/digital conversion of the image signal.

The selection unit 380 selects either the signal line 13 or the signal line 33, and outputs the output of the amplification unit 320 to the selected signal line. This selection unit 380 selects the signal line 13 when performing the reset operation in the pixel 100 and selects the signal line 33 when performing analog/digital conversion of the image signal.

When performing analog/digital conversion of the image signal, the amplification unit 320 shown in FIG. 13 amplifies the voltage corresponding to the difference between the image signal and the reference signal. The amplification unit 320 outputs the difference voltage after the amplification to the counting unit 392 as a result of comparing the image signal and the reference signal. At this time, by setting the gain of the amplification unit 320 to a higher gain than in the case of performing the reset operation in the pixel 100, it is possible to make the output transition steep, and reduce the error of analog/digital conversion.

Since the configuration of the imaging apparatus 1 other than this is similar to that of the imaging apparatus 1 described with reference to the first embodiment of the present technology, the description thereof will be omitted.

As described above, in accordance with the fourth embodiment of the present technology, it is possible to perform analog/digital conversion without providing the comparing unit 331 in the column signal processing unit 30, and simplify the configuration of the imaging apparatus 1.

5. Fifth Embodiment

In the first embodiment described above, noise caused when the state of the reset voltage control unit 101 shifts to the non-conduction state is divided by the coupling capacitor 104 and the charge holding unit 106, thereby reducing the influence of the above-mentioned noise. However, the transition of the state of the reset voltage control unit 101 to the non-conduction state may be made slow to reduce the noise. The fifth embodiment of the present technology is different from the first embodiment in that the transition speed of the state of the reset voltage control unit 101 to the non-conduction state is changed.

"Control Signal"

FIG. 14 is a diagram showing an example of a control signal in the fifth embodiment of the present technology. FIG. 14 shows the waveform of the control signal transmitted through the feedback signal line FB and the reset signal line RST.

As described above, the control signal (on-signal) of the reset voltage control unit 101 is transmitted through the feedback signal line FB, and the control signal (on-signal) of the reset unit 102 is transmitted through the reset signal line RST. By increasing the fall time of these on-signals, the transition speed of the states of the reset voltage control unit 101 and the reset unit 102 from the conduction state to the non-conduction state is reduced. As a result, so-called switching noise can be reduced, and the noise remaining in the charge holding unit 106 can be further reduced. Further, by employing such a waveform, it is also possible to reduce the influence of the propagation delay caused by the signal line 11 arranged in the row of the pixel array unit 10.

Since the configuration of the imaging apparatus 1 other than this is similar to that of the imaging apparatus 1 described in the first embodiment of the present technology, the description thereof will be omitted.

As described above, in accordance with the fifth embodiment of the present technology, by changing the waveform of the control signal, it is possible to reduce noise generated on the basis of the operation of the reset voltage control unit 101 or the like.

6. Sixth Embodiment

In the first embodiment described above, imaging using a rolling shutter system is performed. However, imaging using a global shutter system may be performed. A sixth embodiment of the present technology is different from the first embodiment in that a global shutter system is employed.

"Configuration of Pixel"

FIG. 15 is a diagram showing a configuration example of the pixel 100 in the sixth embodiment of the present technology. The pixel 100 shown in FIG. 15 is different from the pixel 100 described with reference to FIG. 2 in the following points. The pixel 100 in FIG. 15 further includes an overflow gate 111 and a charge transfer section 112. Further, an overflow signal line OFG (Overflow) and a transfer signal line TRG (Transfer Gate) are further wired to the pixel 100 in FIG. 15. The overflow signal line OFG is a signal line for transmitting the on-signal to the overflow gate 111. The transfer signal line TRG is a signal line for transmitting the on-signal to the charge transfer unit 112.

The gate of the overflow gate 111 is connected to the overflow signal line OFG, and the drain of the overflow gate 111 is connected to the power source line Vdd. The cathode of the photoelectric conversion unit 105 is commonly connected to the source of the overflow gate 111 and the source of the charge transfer unit 112. The gate of the charge transfer unit 112 is connected to the transfer signal line TRG, and the drain of the charge transfer unit 112 is connected to the gate of the image signal detection unit 107, the source of the reset unit 102, one end of the charge holding unit 106, and one end of the coupling capacitor 104. Note that a MOS transistor can be used for the overflow gate 111 and the charge transfer unit 112. Since the configuration of the pixel 100 other than this is similar to that of the pixel 100 described with reference to FIG. 2, the description thereof will be omitted.

The overflow gate 111 resets the photoelectric conversion unit 105. The overflow gate 111 performs this resetting by making the photoelectric conversion unit 105 and the power source line Vdd conductive. Further, the overflow gate 111 further discharges the excessively generated charge in the photoelectric conversion unit 105.

The charge transfer unit 112 transfers the charge generated in the photoelectric conversion unit 105 to the charge holding unit 106. This charge transfer unit 112 transfers the charge by making the photoelectric conversion unit 105 and the charge holding unit 106 conductive.

"Image Signal Generation Processing"

FIG. 16 is a diagram showing an example of image signal generation processing in the sixth embodiment of the present technology. FIG. 16 shows the image signal generation processing of the pixels 100 arranged in the first row to the third row in the pixel array unit 10. Since the description in FIG. 16 is similar to that in FIG. 8, the description thereof is omitted.

In the period from T0 to T2, the standard signal supply unit 40 supplies the second standard signal Vb2. This supply of the second standard signal Vb2 continues until T6. Further, an on-signal is input from overflow signal lines OFG1 to OFG3, the overflow gate 111 of the pixel 100 arranged in the pixel array unit 10 is made conductive, and the photoelectric conversion unit 105 is reset (T0). Next, the input of the on-signal to the overflow signal lines OFG1 to OFG3 is stopped (T1). As a result, exposure is started. That is, the photoelectric conversion unit 105 starts holding of the generated charge.

In the period from T2 to T3, an on-signal is input from transfer signal lines TRG1 to TRG3, and the charge transfer units 112 of all the pixels 100 arranged in the pixel array unit 10 are made conductive. As a result, the charge held in the photoelectric conversion unit 105 is transferred to the charge holding unit 106.

In the period from T3 to T6, the input of the on-signal to the transfer signal lines TRG1 to TRG3 is stopped. At the same time, the-on signal is input from the overflow signal lines OFG1 to OFG3 to the overflow gates 111 of all the pixels 100. As a result, exposure is stopped. Note that the input of the on-signal to the overflow signal lines OFG1 to OFG3 continues until T22. Further, the-on signal is input from the selection signal line SEL1, and the image signal selection unit 108 of the pixel 100 in the first row is made conductive. Note that the input of the on-signal to the selection signal line SEL1 continues until T9. Next, the reference signal generation unit 50 generates a reference signal (T4 to T5), and analog/digital conversion of the image signal is performed.

In the period from T6 to T9, an on-signal is input from the feedback signal line FB1 and the reset signal line RST1, and the reset voltage control unit 101 and the reset unit 102 are made conductive. At the same time, the standard signal supply unit 40 supplies the first standard signal Vb1. As a result, resetting is performed in the pixel 100 arranged in the first row. Next, the input of the on-signal to the reset signal line RST1 is stopped (T7). At the same time, the standard signal supply unit 40 starts supply of the second standard signal Vb2. Note that the supply of the second standard signal Vb2 by the standard signal supply unit 40 continues until T12. After that, the input of the on-signal to the feedback signal line FB1 is stopped (T8). As a result, the analog/digital conversion and reset processing of the image signal in the pixel 100 arranged in the first row is completed.

In the period from T9 to T15, the input of the on-signal to the selection signal line SEL1 is stopped, and the on-signal is input to the selection signal line SEL2 (T9). After that, processing similar to that in T3 to T9 is performed in the pixel 100 arranged in the second row.

In the period from T15 to T21, the input of the on-signal to the selection signal line SEL2 is stopped, and the on-signal is input to a selection signal line SEL3 (T15). After that, processing similar to that described above is performed in the pixel 100 arranged in the third row.

In the period from T21 to T23, processing similar to that in T3 to T9 is performed for the pixels 100 arranged in all rows, an image signal corresponding to one screen is acquired from the pixel array unit 10, and resetting of all the pixels 100 arranged in the pixel array unit 10 is completed. Further, the input of the on-signal to the overflow signal lines OFG1 to OFG3 is stopped, and new exposure is started (T22).

In the period from T23 to T24, processing similar to that in T2 to T3 is performed, exposure is stopped, and the charge is transferred from the photoelectric conversion unit 105.

Note that the input of the on-signal to the overflow signal line OFG and stopping of the input are each simultaneously performed for the pixels 100 arranged in all the rows of the pixel array unit 10. Similarly, the input of the on-signal to the transfer signal line TRG and stopping of the input are each simultaneously performed for the pixels 100 arranged in all the rows of the pixel array unit 10. As a result, it is possible to simultaneously start or finish exposure in all the pixels 100 arranged in the pixel array unit 10.

As described above, since the exposure is simultaneously started or finished in all the pixels 100 arranged in the pixel array unit 10, an image signal with less distortion than that in a rolling shutter system can be obtained.

Since the configuration of the imaging apparatus 1 other than this is similar to that of the imaging apparatus 1 described in the first embodiment of the present technology, the description thereof will be omitted.

As described above, in the sixth embodiment of the present technology, the overflow gate 111 and the charge transfer unit 112 are arranged in the pixel 100, resetting of the photoelectric conversion unit 105 and transfer of charges from the photoelectric conversion unit 105 are performed simultaneously for all pixels. As a result, it is possible to employ a global shutter system and improve the image quality.

7. Seventh Embodiment

In the first embodiment described above, the pixel array unit 10 and the column signal processing unit 30 are formed on the same semiconductor chip. However, these units may be formed on different semiconductor chips. A seventh embodiment of the present technology is different from the first embodiment in that the imaging apparatus 1 includes two semiconductor chips.

"Configuration of Imaging Apparatus"

FIG. 17 is a diagram showing a configuration example of the imaging apparatus 1 according to the seventh embodiment of the present technology. The imaging apparatus 1 shown in FIG. 17 includes a pixel chip 2 and a circuit chip 3.

The pixel chip 2 is a semiconductor chip on which the pixel array unit 10 is formed. The vertical drive unit 20 (not shown) can be further formed on this pixel chip 2.

The circuit chip 3 is a semiconductor chip on which the column signal processing unit 30 is formed. The standard signal supply unit 40 (not shown) and the reference signal generation unit 50 (not shown) can be further formed in this circuit chip 3.

The imaging apparatus 1 shown in FIG. 17 is configured by bonding the pixel chip 2 and the circuit chip 3. In FIG. 17, the signal line 12 for transmitting an image signal from the pixel 100 includes pads 122 and 123 and wirings 121 and 124. The pads 122 and 123 are formed on the bonding faces of the pixel chip 2 and the circuit chip 3, respectively, and transmit signals. When the pixel chip 2 and the circuit chip 3 are bonded to each other, the pads 122 and 123 are aligned and bonded so that these pads are in contact with each other. As a result, these pads are electrically connected to each other, and signals can be transmitted. The wiring 121 is formed in the pixel chip 2 and connects the pixel 100 and the pad 122. Further, the wiring 124 is formed in the circuit chip 3 and connects the amplification unit 320 and the pad 123. Similarly to the signal line 12, the signal line 13 includes pads 132 and 133 and wirings 131 and 134.

Further, by bonding the pixel chip 2 and the circuit chip 3 and connecting the signal lines with the pads 122, 123, and the like, the amplification unit 320 can be arranged in the vicinity of, e.g., immediately below, the pixel 100. As a result, the wiring distance of the signal line 13 can be reduced, and the parasitic capacitance of the signal line 13 can be reduced. Since this parasitic capacitance is to be connected to the output of the amplification unit 320, by decreasing this parasitic capacitance, the settling time is reduced and the time required for resetting can be reduced.

Since the configuration of the imaging apparatus 1 other than this is similar to that of the imaging apparatus 1 described in the first embodiment of the present technology, the description thereof will be omitted.

As described above, in accordance with the seventh embodiment of the present technology, by configuring the imaging apparatus 1 by bonding the pixel chip 2 and the circuit chip 3, the time required for resetting can be reduced.

As described above, in accordance with the embodiment of the present technology, by applying voltage lower than the reset voltage to the reset voltage holding unit 103 and the coupling capacitor 104 arranged in the pixel 100 after resetting, it is possible to suppress the dark current to prevent the image quality from being deteriorated.

Note that the above-mentioned embodiments provide examples for embodying the present technology and the matters in the embodiments and the specifying matters in the scope of claims are associated. Similarly, the specifying matters in the scope of claims and the matters in the embodiments of the present technology, which are denoted by the identical names, have correspondence. It should be noted that the present technology is not limited to the embodiments and can be embodied by making various modifications to the embodiments without departing from its essence.

Further, the processing procedures described in the above embodiments may be construed as methods including those series of procedures, a program for causing a computer to execute those series of procedures, or a recording medium storing that program. As this recording medium, a CD (Compact Disc), an MD (Mini Disc), a DVD (Digital Versatile Disc), a memory card, and a Blu-ray (registered trademark) disc can be used, for example.

It should be noted that the effects described herein are merely examples and not limitative. Further, other effects may be provided.

It should be noted that the present technology may take the following configurations.

(1) An image sensor, including:

a charge holding unit that holds a charge corresponding to irradiation light, the charge holding unit being connected to a charge detection node for detecting voltage corresponding to the held charge as an image signal;

an amplification unit that outputs, as reset voltage of the charge holding unit, voltage corresponding to a difference between a standard signal serving as a reference of the image signal and the detected image signal;

a reset unit that resets the charge holding unit by making the charge detection node and an output of the amplification unit conductive;

a coupling capacitor that transmits the output reset voltage to the charge holding unit, the coupling capacitor being disposed between the charge detection node and the output of the amplification unit; and a standard signal supply unit that supplies the standard signal to the amplification unit where the charge detection node and the output of the amplification unit are conductive, and supplies a standard signal different from the standard signal to the amplification unit where the charge detection node and the output of the amplification unit are non-conductive.

(2) The image sensor according to (1) above, in which the standard signal supply unit supplies a standard signal having voltage lower than that of the standard signal to the amplification unit where the charge detection node and the output of the amplification unit are non-conductive.

(3) The image sensor according to (1) or (2) above, further including:

a reset voltage control unit that controls transfer of the output reset voltage to the coupling capacitor, the reset voltage control unit being disposed between the output of the amplification unit and the coupling capacitor; and a reset voltage holding unit that holds the controlled reset voltage, the reset voltage holding unit being connected to the output of reset voltage control unit.

(4) The image sensor according to any one of (1) to (3) above, in which the amplification unit further amplifies the voltage corresponding to the difference, and changes a bandwidth in the amplification unit depending on whether or not the charge detection node and the output of the amplification unit are conductive.

(5) The image sensor according to any one of (1) to (4) above, further including an image signal output unit that outputs the detected image signal, the image signal output unit being connected to the charge detection node.

(6) The image sensor according to any one of (1) to (5) above, further including:

a reference signal generation unit that generates a reference signal serving as a reference for performing analog/digital conversion of the output image signal; and a holding unit that holds a digital signal corresponding to the reference signal on the basis of a result of comparing the output image signal and the generated reference signal, and outputs the held digital signal as a result of analog/digital conversion of the image signal, in which the amplification unit further outputs voltage corresponding to a difference between the output image signal and the generated reference signal to the holding unit as a result of the comparison.

(7) The image sensor according to (6) above, in which the amplification unit amplifies voltage corresponding to a difference between the output image signal and the supplied standard signal, and amplifies, with a gain that is different from that in the amplification, voltage corresponding to a difference between the output image signal and the generated reference signal.

(8) An imaging apparatus, including:
a charge holding unit that holds a charge corresponding to irradiation light, the charge holding unit being connected to a charge detection node for detecting voltage corresponding to the held charge as an image signal;
an amplification unit that outputs, as reset voltage of the charge holding unit, voltage corresponding to a difference between a standard signal serving as a reference of the image signal and the detected image signal;
a reset unit that resets the charge holding unit by making the charge detection node and an output of the amplification unit conductive;
a coupling capacitor that transmits the output reset voltage to the charge holding unit, the coupling capacitor being disposed between the charge detection node and the output of the amplification unit;
a standard signal supply unit that
supplies the standard signal to the amplification unit where the charge detection node and the output of the amplification unit are conductive, and
supplies a standard signal different from the standard signal to the amplification unit where the charge detection node and the output of the amplification unit are non-conductive; and
a processing circuit that processes the detected image signal.

(9) An imaging device that includes a pixel, the pixel comprising:
a photodetector;
a control transistor;
a capacitor coupled to the photodetector;
a reset transistor coupled between the control transistor and the capacitor;
an amplifier transistor having a gate terminal coupled to the capacitor; and
a select transistor coupled to the amplifier transistor;
a first signal line coupled to the select transistor; and
a first amplifying circuit including a first input terminal coupled to the first signal line and a second input terminal configured to receive a first reference signal and an output terminal coupled to the control transistor.

(10) The imaging device according to (9), further comprising a switch circuit coupled to the second input terminal of the first amplifying circuit, wherein the switch circuit is configured to couple the second input terminal of the first amplifying circuit to the first reference signal or a second reference signal.

(11) The imaging device according to (10), further comprising a reference signal generation circuit coupled to the switch circuit.

(12) The imaging device according to (11), wherein the reference signal generation circuit is configured to provide the first reference signal and the second reference signal.

(13) The imaging device according to any one of (9) through (12), further comprising a second amplifying circuit, wherein a first input terminal of the second amplifying circuit is coupled to the select transistor.

(14) The imaging device according to (13), wherein a second input terminal of the second amplifying circuit is configured to receive a second reference signal different from the first reference signal.

(15) The imaging device according to (13) or (14), further comprising a switch circuit configured to selectively couple an output of the first amplifying circuit or an output of the second amplifying circuit to the control transistor.

(16) The imaging device according to (14) or (15), further comprising a reference signal generation circuit configured to provide the first reference signal and the second reference signal.

(17) The imaging device according to any one of (14) through (16), wherein a first output of the reference signal generation circuit is coupled to the second input terminal of the first amplifying circuit and a second output of the reference signal generation circuit is coupled to the second input terminal of the second amplifying circuit.

(18) The imaging device according to any one of (13) through (17), wherein the first input terminal of the second amplifying circuit is coupled to the select transistor via a second signal line.

(19) An electronic apparatus comprising an imaging device that includes a pixel, the pixel comprising:
a photodetector;
a control transistor;
a capacitor coupled to the photodetector;
a reset transistor coupled between the control transistor and the capacitor;
an amplifier transistor having a gate terminal coupled to the capacitor; and
a select transistor coupled to the amplifier transistor;
a first signal line coupled to the select transistor; and
a first amplifying circuit including a first input terminal coupled to the first signal line and a second input terminal configured to receive a first reference signal and an output terminal coupled to the control transistor

(20) The electronic apparatus according to (19), further comprising a switch circuit coupled to the second input terminal of the first amplifying circuit, wherein the switch circuit is configured to couple the second input terminal of the first amplifying circuit to the first reference signal or a second reference signal.

(21) The electronic apparatus according to (20), further comprising a reference signal generation circuit coupled to the switch circuit.

(22) The electronic apparatus according to (21), wherein the reference signal generation circuit is configured to provide the first reference signal and the second reference signal.

(23) The electronic apparatus according to any one of (19) through (22), further comprising a second amplifying circuit, wherein a first input terminal of the second amplifying circuit is coupled to the select transistor.

(24) The electronic apparatus according to (23), wherein a second input terminal of the second amplifying circuit is configured to receive a second reference signal different from the first reference signal.

(25) The electronic apparatus according to (23) or (24), further comprising a switch circuit configured to selectively couple an output of the first amplifying circuit or an output of the second amplifying circuit to the control transistor.

(26) The electronic apparatus according to (24) or (25), further comprising a reference signal generation circuit configured to provide the first reference signal and the second reference signal.

(27) The electronic apparatus according to any one of (24) through (26), wherein a first output of the reference signal generation circuit is coupled to the second input terminal of the first amplifying circuit and a second output of the reference signal generation circuit is coupled to the second input terminal of the second amplifying circuit.

(28) The electronic apparatus according to any one of (23) through (27), wherein the first input terminal of the second amplifying circuit is coupled to the select transistor via a second signal line.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 2 pixel chip
3 circuit chip
10 pixel array unit
20 vertical drive unit
30 column signal processing unit
40 standard signal supply unit
42, 43, 45, 46 voltage source
44, 47, 360, 370, 380 selection unit
50 reference signal generation unit
100 pixel
101 reset voltage control unit
102 reset unit
103 reset voltage holding unit
104 coupling capacitor
105 photoelectric conversion unit
106 charge holding unit
107 image signal detection unit
108 image signal selection unit
109 charge detection node
111 overflow gate
112 charge transfer unit
122, 123, 132, 133 pad
310 constant current power supply
320, 350 amplification unit
330, 390 analog/digital conversion unit
331 comparing unit
332, 392 counting unit
333, 393 holding unit
340 image signal transfer unit

The invention claimed is:

1. An imaging device that includes a pixel, the pixel comprising:
a photodetector;
a control transistor;
a capacitor coupled to the photodetector;
a reset transistor coupled between the control transistor and the capacitor;
an amplifier transistor having a gate terminal coupled to the capacitor;
a select transistor coupled to the amplifier transistor;
a first signal line coupled to the select transistor; and
a first amplifying circuit including a first input terminal coupled to the first signal line and a second input terminal configured to receive a first reference signal and an output terminal coupled to the control transistor.

2. The imaging device according to claim 1, further comprising a switch circuit coupled to the second input terminal of the first amplifying circuit, wherein the switch circuit is configured to couple the second input terminal of the first amplifying circuit to the first reference signal or a second reference signal.

3. The imaging device according to claim 2, further comprising a reference signal generation circuit coupled to the switch circuit.

4. The imaging device according to claim 3, wherein the reference signal generation circuit is configured to provide the first reference signal and the second reference signal.

5. The imaging device according to claim 1, further comprising a second amplifying circuit, wherein a first input terminal of the second amplifying circuit is coupled to the select transistor.

6. The imaging device according to claim 5, wherein a second input terminal of the second amplifying circuit is configured to receive a second reference signal different from the first reference signal.

7. The imaging device according to claim 6, further comprising a switch circuit configured to selectively couple an output of the first amplifying circuit or an output of the second amplifying circuit to the control transistor.

8. The imaging device according to claim 7, further comprising a reference signal generation circuit configured to provide the first reference signal and the second reference signal.

9. The imaging device according to claim 8, wherein a first output of the reference signal generation circuit is coupled to the second input terminal of the first amplifying circuit and a second output of the reference signal generation circuit is coupled to the second input terminal of the second amplifying circuit.

10. The imaging device according to claim 9, wherein the first input terminal of the second amplifying circuit is coupled to the select transistor via a second signal line.

11. An electronic apparatus comprising an imaging device that includes a pixel, the pixel comprising:
a photodetector;
a control transistor;
a capacitor coupled to the photodetector;
a reset transistor coupled between the control transistor and the capacitor;
an amplifier transistor having a gate terminal coupled to the capacitor;
a select transistor coupled to the amplifier transistor;
a first signal line coupled to the select transistor; and
a first amplifying circuit including a first input terminal coupled to the first signal line and a second input terminal configured to receive a first reference signal and an output terminal coupled to the control transistor.

12. The electronic apparatus according to claim 11, further comprising a switch circuit coupled to the second input terminal of the first amplifying circuit, wherein the switch circuit is configured to couple the second input terminal of the first amplifying circuit to the first reference signal or a second reference signal.

13. The electronic apparatus according to claim 12, further comprising a reference signal generation circuit coupled to the switch circuit.

14. The electronic apparatus according to claim 13, wherein the reference signal generation circuit is configured to provide the first reference signal and the second reference signal.

15. The electronic apparatus according to claim 11, further comprising a second amplifying circuit, wherein a first input terminal of the second amplifying circuit is coupled to the select transistor.

16. The electronic apparatus according to claim 15, wherein a second input terminal of the second amplifying circuit is configured to receive a second reference signal different from the first reference signal.

17. The electronic apparatus according to claim 16, further comprising a switch circuit configured to selectively couple an output of the first amplifying circuit or an output of the second amplifying circuit to the control transistor.

18. The electronic apparatus according to claim 17, further comprising a reference signal generation circuit configured to provide the first reference signal and the second reference signal.

19. The electronic apparatus according to claim 18, wherein a first output of the reference signal generation circuit is coupled to the second input terminal of the first amplifying circuit and a second output of the reference signal generation circuit is coupled to the second input terminal of the second amplifying circuit.

20. The electronic apparatus according to claim 19, wherein the first input terminal of the second amplifying circuit is coupled to the select transistor via a second signal line.

* * * * *